(12) United States Patent
Nakagawa et al.

(10) Patent No.: US 9,583,054 B2
(45) Date of Patent: Feb. 28, 2017

(54) MULTI-PRIMARY COLOR DISPLAY DEVICE

(71) Applicant: Sharp Kabushiki Kaisha, Osaka-shi, Osaka (JP)

(72) Inventors: Shinji Nakagawa, Osaka (JP); Hiroyuki Furukawa, Osaka (JP); Kazuyoshi Yoshiyama, Osaka (JP); Yasuhiro Yoshida, Osaka (JP)

(73) Assignee: Sharp Kabushiki Kaisha, Sakai (JP)

( * ) Notice: Subject to any disclaimer, the term of this patent is extended or adjusted under 35 U.S.C. 154(b) by 118 days.

(21) Appl. No.: 14/440,652

(22) PCT Filed: Nov. 7, 2013

(86) PCT No.: PCT/JP2013/080104
§ 371 (c)(1),
(2) Date: May 5, 2015

(87) PCT Pub. No.: WO2014/077179
PCT Pub. Date: May 22, 2014

(65) Prior Publication Data
US 2015/0294628 A1 Oct. 15, 2015

(30) Foreign Application Priority Data

Nov. 14, 2012 (JP) .................................. 2012-250224

(51) Int. Cl.
*G09G 3/36* (2006.01)
*G09G 3/20* (2006.01)
*H01L 27/32* (2006.01)

(52) U.S. Cl.
CPC ......... *G09G 3/3607* (2013.01); *G09G 3/2003* (2013.01); *G09G 3/3611* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 2007/0268208 | A1* | 11/2007 | Okada | G02F 1/133514 345/55 |
| 2009/0167657 | A1* | 7/2009 | Tomizawa | G09G 3/2003 345/88 |
| 2010/0053235 | A1 | 3/2010 | Tomizawa et al. | |

FOREIGN PATENT DOCUMENTS

| | | |
|---|---|---|
| JP | 2011-118000 A | 6/2011 |
| WO | 2006/018926 A1 | 2/2006 |

(Continued)

OTHER PUBLICATIONS

Pointer, "The Gamut of Real Surface Colours," Color Research and Application, vol. 5, No. 3, Fall 1980, pp. 145-155.

*Primary Examiner* — Van Chow
(74) *Attorney, Agent, or Firm* — Keating & Bennett, LLP

(57) ABSTRACT

A signal conversion circuit (20) of a multiprimary display device (100) includes a low-range multiprimary signal generation section (21), a high-range luminance signal generation section (22), and a rendering process section (23). The low-range multiprimary signal generation section includes a first filter section (21a) which is capable of extracting a low-range component from an input image signal and a multiprimary conversion section (21b), whereas the high-range luminance signal generation section includes a luminance conversion section (22a) and a second filter section (22b) which extracts a high-range component of a luminance signal. The signal conversion circuit further includes a chromaticity conversion section (24) and a luminance/chromaticity change detection section (25). As a frequency characteristics profile of the first filter section, one frequency characteristics profile is selected from among a plurality of predefined frequency characteristics profiles, in accordance with a result of detection by the luminance/chromaticity change detection section.

15 Claims, 16 Drawing Sheets

(52) U.S. Cl.
CPC ........... *G09G 2300/0452* (2013.01); *G09G 2320/0666* (2013.01); *G09G 2340/0457* (2013.01); *G09G 2340/06* (2013.01); *H01L 27/3213* (2013.01)

(56) References Cited

FOREIGN PATENT DOCUMENTS

| WO | 2007/097080 A1 | 8/2007 |
| WO | 2008/065935 A1 | 6/2008 |
| WO | 2012/067037 A1 | 5/2012 |
| WO | 2012/067038 A1 | 5/2012 |

* cited by examiner

FIG.18

| | | | | | | | | | | | | |
|---|---|---|---|---|---|---|---|---|---|---|---|---|
| LOW-RANGE COMPONENT | L(2n−2,4) | L(2n−2,5) | L(2n−2,6) | L(2n,1) | L(2n,2) | L(2n,3) | L(2n,4) | L(2n,5) | L(2n,6) | L(2n+2,1) | L(2n+2,2) | L(2n+2,3) |
| | L(2n−1,4) | L(2n−1,5) | L(2n−1,6) | L(2n−1,1) | L(2n−1,2) | L(2n−1,3) | L(2n+1,4) | L(2n+1,5) | L(2n+1,6) | L(2n+1,1) | L(2n+1,2) | L(2n+1,3) |
| HIGH-RANGE COMPONENT | H(2n−2) | | | H(2n−1) | | | H(2n) | | | H(2n+1) | | H(2n+2) |
| PIXEL VALUE | P(2n−2,4) | P(2n−2,5) | P(2n−2,6) | P(2n,1) | P(2n,2) | P(2n,3) | P(2n,4) | P(2n,5) | P(2n,6) | P(2n+2,1) | P(2n+2,2) | P(2n+2,3) |
| | P(2n−1,4) | P(2n−1,5) | P(2n−1,6) | P(2n−1,1) | P(2n−1,2) | P(2n−1,3) | P(2n+1,4) | P(2n+1,5) | P(2n+1,6) | P(2n+1,1) | P(2n+1,2) | P(2n+1,3) |
| FIRST VIRTUAL PIXEL WEIGHT | W(1,4) | W(1,5) | W(1,6) | W(1,1) | W(1,2) | W(1,3) | W(1,4) | W(1,5) | W(1,6) | W(1,1) | W(1,2) | W(1,3) |
| SECOND VIRTUAL PIXEL WEIGHT | W(2,4) | W(2,5) | W(2,6) | W(2,1) | W(2,2) | W(2,3) | W(2,4) | W(2,5) | W(2,6) | W(2,1) | W(2,2) | W(2,3) |
| VIRTUAL PIXEL RENDERING RESULT | V(n−1,4) | V(n−1,5) | V(n−1,6) | V(n,1) | V(n,2) | V(n,3) | V(n,4) | V(n,5) | V(n,6) | V(n+1,1) | V(n+1,2) | V(n+1,3) |

*FIG.19*

| PIXEL VALUE | $P(2n,1)$ | $P(2n,2)$ | $P(2n,3)$ | $P(2n,4)$ | $P(2n,5)$ | $P(2n,6)$ |
|---|---|---|---|---|---|---|
| | $P(2n-1,1)$ | $P(2n-1,2)$ | $P(2n-1,3)$ | $P(2n+1,4)$ | $P(2n+1,5)$ | $P(2n+1,6)$ |
| FIRST VIRTUAL PIXEL WEIGHT | 0 | 0.5 | 1 | 1 | 0.5 | 0 |
| SECOND VIRTUAL PIXEL WEIGHT | 1 | 0.5 | 0 | 0 | 0.5 | 1 |
| VIRTUAL PIXEL RENDERING RESULT | $V(n,1)$ $= P(2n-1,1)$ | $V(n,2)$ $= [P(2n-1,2)+P(2n,2)]/2$ | $V(n,3)$ $= P(2n,3)$ | $V(n,4)$ $= P(2n,4)$ | $V(n,5)$ $= [P(2n,5)+P(2n-1,5)]/2$ | $V(n,6)$ $= P(2n+1,6)$ |

FIG.21
(a)
INPUT SIGNAL TO FIRST FILTER SECTION
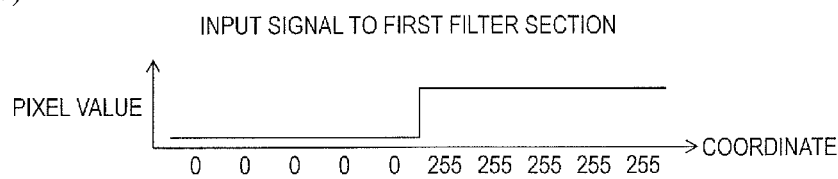
(b)
FILTER COEFFICIENT    OUTPUT SIGNAL FROM FIRST FILTER SECTION
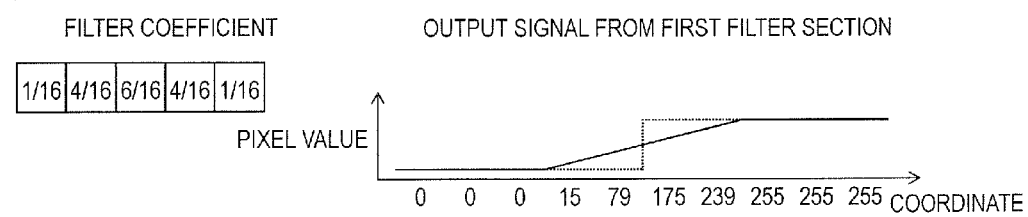
(c)
FILTER COEFFICIENT    OUTPUT SIGNAL FROM FIRST FILTER SECTION
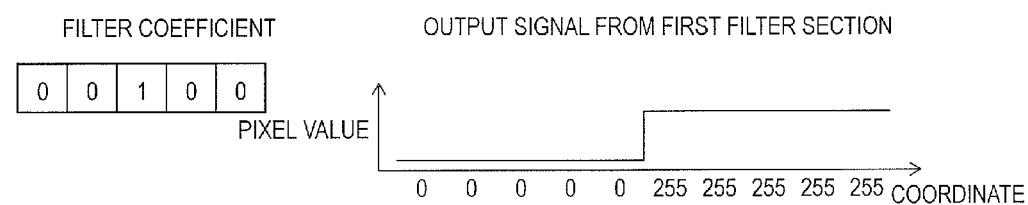

FIG.22
(a)
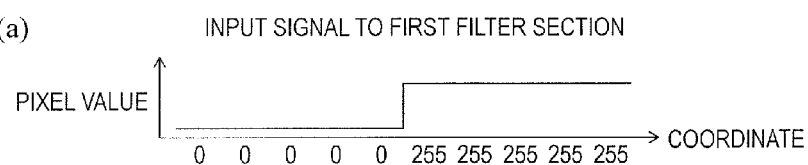
(b)
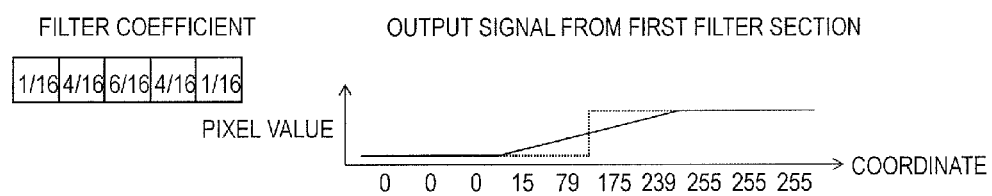
(c)
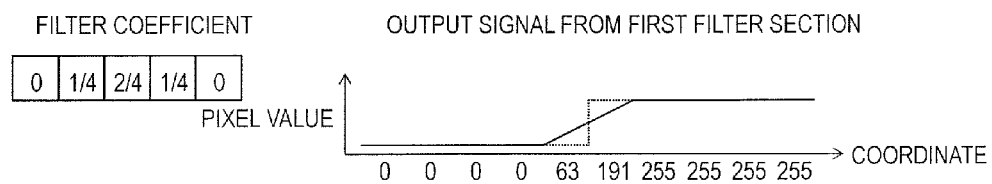

FIG.23
(a)
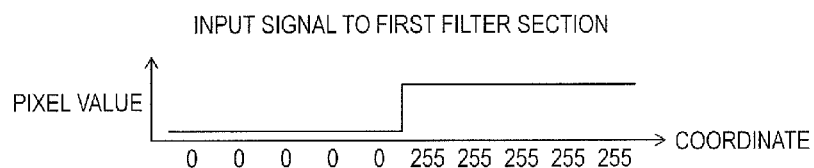
(b)
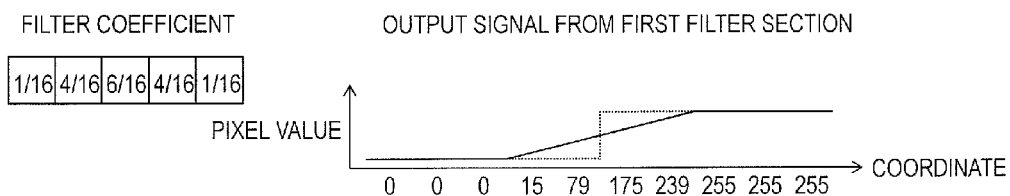
(c)
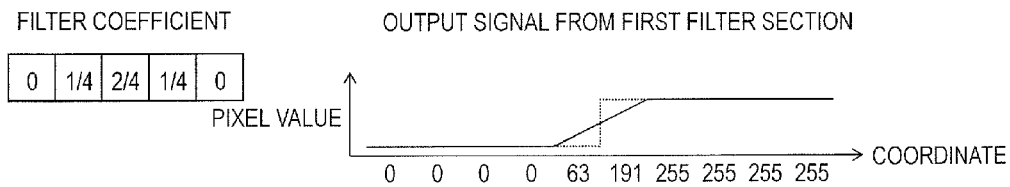
(d)
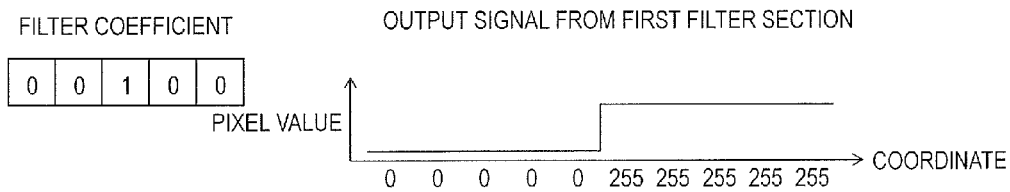

MULTI-PRIMARY COLOR DISPLAY DEVICE

TECHNICAL FIELD

The present invention relates to a display device, and more particularly to a multiprimary display device which performs display by using four or more primary colors.

BACKGROUND ART

In commonly-used display devices, each pixel is composed of three subpixels for displaying three primaries of light, i.e., red, green, and blue, whereby multicolor display is achieved.

However, conventional display devices have a problem in that they can only display colors in a narrow range (called a "color gamut"). When the color gamut is narrow, some object colors (i.e., colors of various objects existing in nature; see Non-Patent Document 1) cannot be displayed. Therefore, in order to broaden the color gamut of a display device, there has been proposed a technique which increases the number of primary colors to be used for displaying.

For example, Patent Document 1 discloses a display device which performs display by using six primary colors. Patent Document 1 also discloses a display device which performs display by using four primary colors and a display device which performs display by using five primary colors. An example of a display device which performs display by using six primary colors is shown in FIG. 25. In a display device 800 shown in FIG. 25, one pixel P is composed of a red subpixel R, a green subpixel G, a blue subpixel B, a cyan subpixel C, a magenta subpixel M, and a yellow subpixel Ye. The display device 800 attains multicolor displaying by intermixing the six primary colors of red, green, blue, cyan, magenta, and yellow which are displayed by the six subpixels.

Increasing the number of primary colors to be used for displaying, i.e., performing display by using four or more primary colors, provides a broader color gamut than those of conventional display devices which perform display by using three primaries. In the present specification, display devices which perform display by using four or more primary colors will be referred to as "multiprimary display devices", and display devices which perform display by using three primary colors (i.e., those which are conventional and commonly used) will be referred to as "three-primary display devices".

However, given the same screen size, in order for a multiprimary display device to display an image having a similar resolution to that of a three-primary display device, the device structure needs to become finer, whereby the production cost is increased. The reason is as follows. When the number of subpixels per pixel increases from 3, to 4 or more in a multiprimary display device, the subpixel size needs to become smaller than that of a three-primary display device in order to obtain the same number of pixels in the same screen size. Specifically, given a number m of primary colors to be used for displaying (m≥4), the subpixel size must become 3/m. For example, in a multiprimary display device which performs display by using six primary colors, the subpixel size must be made ½(=3/6).

Techniques for solving this problem are proposed in Patent Documents 2 and 3. In the multiprimary display devices disclosed in Patent Documents 2 and 3, the plurality of subpixels composing each pixel are regrouped into a plurality of imaginary pixels (called "virtual pixels"), and display is performed by regarding each of the plurality of virtual pixels is regarded as the smallest unit of multicolor displaying. As a result, even if the resolution of an input image is higher than the panel resolution, it is possible to suitably perform display.

Thus, the multiprimary display devices of Patent Documents 2 and 3 can provide a displaying resolution that is higher than the panel resolution, so that an image having a similar or higher resolution can be displayed with the same subpixel size and screen size as those of the three-primary display device. Moreover, they can be produced with a similar cost to that of a three-primary display device.

As a specific exemplary construction of multiprimary display devices capable of performing display with virtual pixels as described above, Patent Documents 2 and 3 disclose a construction where a signal conversion circuit for converting a three-primary image signal into a multiprimary image signal has a low-range multiprimary signal generation section, a high-range luminance signal generation section, and a rendering process section.

The low-range multiprimary signal generation section of this construction generates a low-range multiprimary signal based on an input image signal. The low-range multiprimary signal is a signal in which a low-range component of the input image signal has been adapted to multiprimaries. Based on the input image signal, the high-range luminance signal generation section generates a high-range luminance signal. The high-range luminance signal is a signal in which a high-range component of the input image signal has been subjected to luminance conversion. The rendering process section performs a rendering process onto a plurality of virtual pixels, based on the low-range multiprimary signal which has been generated by the low-range multiprimary signal generation section and the high-range luminance signal which has been generated by the high-range luminance signal generation section.

In the signal conversion circuit of the above construction, human visual characteristics are taken into account, i.e., there being higher sensitivity with respect to a luminance signal than with respect to a color signal (i.e., the luminous factor as to color differences is lower than the luminous factor as to luminance); thus, a multiprimary process is applied to the low-range component of an input image signal, whereas a luminance conversion process is applied to the high-range component. Then, the low-range multiprimary signal and the high-range luminance signal resulting from these processes are combined, and rendered onto virtual pixels, whereby an image signal (multiprimary image signal) corresponding to four or more primary colors is output.

CITATION LIST

Patent Literature

[Patent Document 1] International Publication No. 2006/018926
[Patent Document 2] International Publication No. 2012/067037
[Patent Document 3] International Publication No. 2012/067038

Non-Patent Literature

[Non-Patent Document 1] M. R. Pointer, "The gamut of real surface colors", Color Research and Application, Vol. 5, No. 3, pp. 145-155 (1980)

SUMMARY OF INVENTION

Technical Problem

However, upon an intensive study by the inventors, it was found that a multiprimary display device having a signal conversion circuit of the above construction may not be able to provide an improved resolution depending on the input image. Specifically, if the input image includes a region that has some chromaticity differences but has no luminance differences, an effect of resolution improvement is not obtained for that region, the perceived resolution will be deteriorated.

The present invention has been made in view of the above problems, and an objective thereof is, in a multiprimary display device which can display an image having a similar or higher resolution without the need to reduce the subpixel size relative to a three-primary display device, to prevent a decrease in the perceived resolution in regions with comparatively small changes in luminance and comparatively large changes in chromaticity.

Solution to Problem

A multiprimary display device according to an embodiment of the present invention is a multiprimary display device having a plurality of pixels arranged in a matrix which includes a plurality of rows and a plurality of columns, each of the plurality of pixels being composed of a plurality of subpixels, the plurality of subpixels including at least four subpixels for displaying respectively different colors, the multiprimary display device comprising: a multiprimary display panel having the plurality of subpixels in each of the plurality of pixels; and a signal conversion circuit which converts an input image signal corresponding to three primaries into a multiprimary image signal corresponding to four or more primary colors, wherein, the plurality of subpixels composing each pixel are regrouped into a plurality of virtual pixels so as to perform display by using each of the plurality of virtual pixels as a smallest unit of multicolor displaying; the signal conversion circuit includes a low-range multiprimary signal generation section which generates a low-range multiprimary signal based on the input image signal, the low-range multiprimary signal being a signal in which a low-range component of the input image signal has been adapted to multiprimaries, a high-range luminance signal generation section which generates a high-range luminance signal based on the input image signal, the high-range luminance signal being a signal in which a high-range component of the input image signal has been subjected to luminance conversion, and a rendering process section which performs a rendering process onto the plurality of virtual pixels based on the low-range multiprimary signal and the high-range luminance signal; the low-range multiprimary signal generation section includes a first filter section capable of extracting a low-range component from the input image signal, and a multiprimary conversion section which adapts the low-range component extracted by the first filter section to multiprimaries; the high-range luminance signal generation section includes a luminance conversion section which subjects the input image signal to luminance conversion to generate a luminance signal, and a second filter section which extracts a high-range component of the luminance signal generated by the luminance conversion section as the high-range luminance signal; the signal conversion circuit further includes a chromaticity conversion section which subjects the input image signal to chromaticity conversion to generate a chromaticity signal, and a luminance/chromaticity change detection section which detects changes in luminance and chromaticity based on the luminance signal generated by the luminance conversion section and the chromaticity signal generated by the chromaticity conversion section; and as a frequency characteristics profile of the first filter section, one frequency characteristics profile is selected from among a plurality of predefined frequency characteristics profiles in accordance with a result of detection by the luminance/chromaticity change detection section.

In one embodiment, the plurality of frequency characteristics profiles include a frequency characteristics profile which causes the first filter section to pass the input image signal substantially without being filtered.

In one embodiment, in accordance with a result of detection by the luminance/chromaticity change detection section, the first filter section either extracts a low-range component from the input image signal or passes the input image signal substantially without being filtered.

In one embodiment, the first filter section extracts a low-range component from the input image signal when (a) a detected change in luminance is within a predetermined first range of luminance change, and when (b) a detected change in luminance is within a second range of luminance change which lies below a lower limit of the first range of luminance change and a detected change in chromaticity is within a predetermined first range of chromaticity change, or passes the input image signal substantially without being filtered when (c) a detected change in luminance is within the second range of luminance change and a detected change in chromaticity is within a second range of chromaticity change which lies above an upper limit of the first range of chromaticity change.

In one embodiment, in accordance with a result of detection by the luminance/chromaticity change detection section, the first filter section either extracts a low-range component from the input image signal with a first frequency characteristics profile, or extracts a low-range component from the input image signal with a second frequency characteristics profile which is gentler than the first frequency characteristics profile.

In one embodiment, the first filter section extracts a low-range component from the input image signal with the first frequency characteristics profile when (a) a detected change in luminance is within a predetermined first range of luminance change, and when (b) a detected change in luminance is within a second range of luminance change which lies below a lower limit of the first range of luminance change and a detected change in chromaticity is within a predetermined first range of chromaticity change, or extracts a low-range component from the input image signal with the second frequency characteristics profile when (c) a detected change in luminance is within the second range of luminance change and a detected change in chromaticity is within a second range of chromaticity change which lies above an upper limit of the first range of chromaticity change.

In one embodiment, the plurality of frequency characteristics profiles include three or more frequency characteristics profiles.

In one embodiment, in accordance with a result of detection by the luminance/chromaticity change detection section, the first filter section either extracts a low-range component from the input image signal with a first frequency characteristics profile, extracts a low-range component from the input image signal with a second frequency characteristics profile which is gentler than the first frequency characteristics profile, or passes the input image signal substantially without being filtered.

In one embodiment, the first filter section extracts a low-range component from the input image signal with the first frequency characteristics profile when (a) a detected change in luminance is within a predetermined first range of luminance change and when (b) a detected change in chromaticity is within a predetermined first range of chromaticity change, extracts a low-range component from the input image signal with the second frequency characteristics profile when (c) a detected change in luminance is within a second range of luminance change which lies below a lower limit of the first range of luminance change and a detected change in chromaticity is within a second range of chromaticity change which lies above an upper limit of the first range of chromaticity change, when (d) a detected change in luminance is within a third range of luminance change which lies below a lower limit of the second range of luminance change and a detected change in chromaticity is within the second range of chromaticity change, and when (e) a detected change in luminance is within the second range of luminance change and a detected change in chromaticity is within a third range of chromaticity change which lies above an upper limit of the second range of chromaticity change, or passes the input image signal substantially without being filtered when (f) a detected change in luminance is within the third range of luminance change and a detected change in chromaticity is within the third range of chromaticity change.

In one embodiment, the signal conversion circuit further includes a third filter section which extracts a high-range component of the chromaticity signal generated by the chromaticity conversion section; and the luminance signal and the chromaticity signal are input to the luminance/chromaticity change detection section after passing through the second filter section and the third filter section, respectively.

In one embodiment, the multiprimary display device having the above construction is capable of changing a regrouping pattern of regrouping the plurality of subpixels into the plurality of virtual pixels.

In one embodiment, each of the plurality of virtual pixels is composed of two or more subpixels among the plurality of subpixels.

In one embodiment, the plurality of rows are substantially parallel to a horizontal direction of a display surface; and in each of the plurality of pixels, the plurality of subpixels are arranged in 1 row by plural columns.

In one embodiment, the plurality of subpixels include a red subpixel for displaying red, a green subpixel for displaying green, and a blue subpixel for displaying blue; and the plurality of subpixels further include at least one of a cyan subpixel for displaying cyan, a magenta subpixel for displaying magenta, a yellow subpixel for displaying yellow, a white subpixel for displaying white, and a red subpixel for displaying red.

In one embodiment, the multiprimary display device having the above construction is a liquid crystal display device.

Advantageous Effects of Invention

According to an embodiment of the present invention, in a multiprimary display device which can display an image having a similar or higher resolution without the need to reduce the subpixel size relative to a three-primary display device, it is possible to prevent a decrease in the perceived resolution in regions with comparatively small changes in luminance and comparatively large changes in chromaticity.

BRIEF DESCRIPTION OF DRAWINGS

FIG. 18 A table showing rendering results for a part of a pixel row in the case where rendering is performed by using the signal conversion circuit 20' of Comparative Example, where a low-range component, a high-range component, pixel values, weights for the respective primary colors in a first virtual pixel, weights for the respective primary colors in a second virtual pixel, and virtual pixels are taken into consideration.

FIG. 19 A table showing pixel values and rendering results when a weight $W(1,m)$ for an $m^{th}$ primary color in a first virtual pixel and a weight W(2,m) for an m$^{th}$ primary color in a second virtual pixel are set to certain values.

FIG. 21(a) to (c) are diagrams showing the relationship between a signal which is input to a first filter section 21a, filter coefficients of the first filter section 21a, and a signal which is output from the first filter section 21a.

FIG. 22(a) to (c) are diagrams showing the relationship between a signal which is input to a first filter section 21a, filter coefficients of the first filter section 21a, and a signal which is output from the first filter section 21a.

FIG. 23(a) to (d) are diagrams showing the relationship between a signal which is input to a first filter section 21a, filter coefficients of the first filter section 21a, and a signal which is output from the first filter section 21a.

DESCRIPTION OF EMBODIMENTS

Hereinafter, embodiments of the present invention will be described with reference to the drawings. Although liquid crystal display devices are exemplified below, the present invention is not limited to liquid crystal display devices, but is suitably used for other display devices, such as organic EL display devices.

Figure 1:
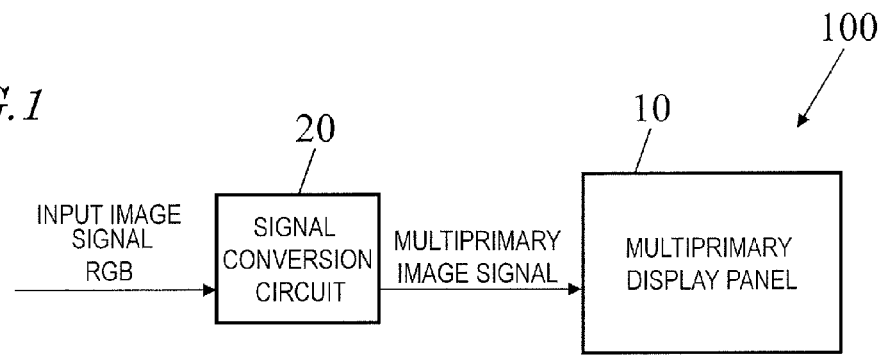
FIG. 1 A block diagram schematically showing a liquid crystal display device (multiprimary display device) 100 according to a preferred embodiment of the present invention.

FIG. 1 shows a liquid crystal display device 100 according to the present embodiment. As shown in FIG. 1, the liquid crystal display device 100 is a multiprimary display device which includes a multiprimary display panel 10 and a signal conversion circuit 20 to perform display by using four or more primary colors.

Figure 2:
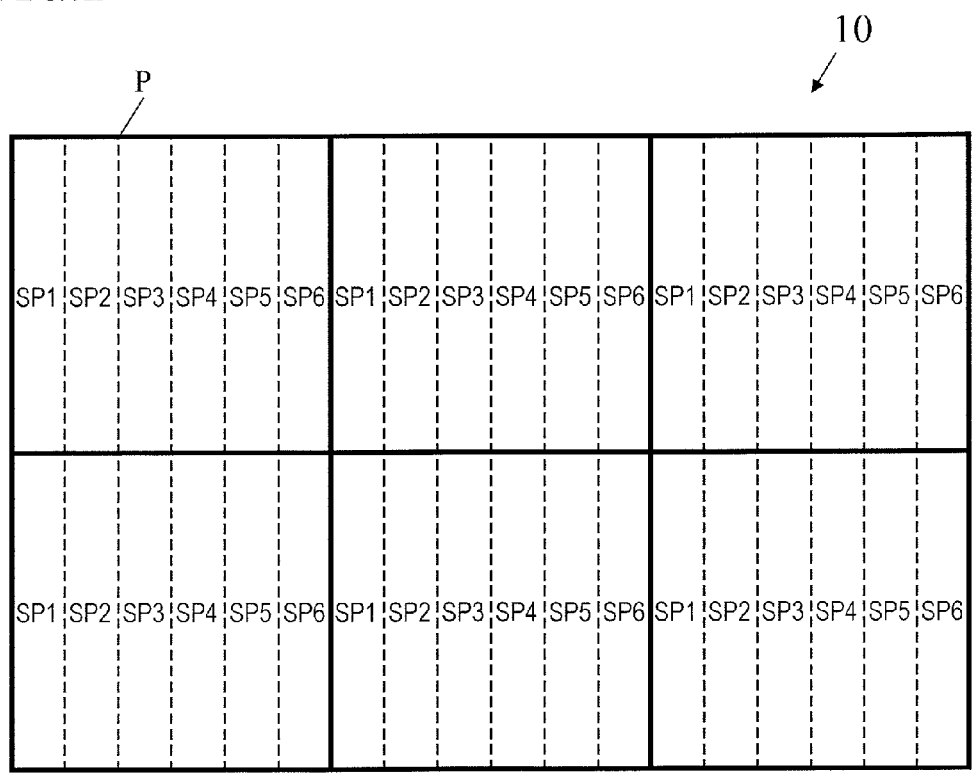
FIG. 2 A diagram showing an exemplary subpixel arrangement of a multiprimary display panel 10 included in the liquid crystal display device 100.

Although not shown in FIG. 1, the multiprimary display panel 10 has a plurality of pixels arranged in a matrix including a plurality of rows and a plurality of columns. Each of the plurality of pixels is composed of a plurality of subpixels. The plurality of subpixels composing each pixel include at least four subpixels which display respectively different primary colors. FIG. 2 shows an example of a specific pixel structure (subpixel arrangement) of the multiprimary display panel 10.

In the multiprimary display panel 10 shown in FIG. 2, each of the plurality of pixels P arranged in a matrix is composed of six subpixels SP1 to SP6. In each pixel P, the six subpixels SP1 to SP6 are arranged in 1 row by 6 columns. The six subpixels SP1 to SP6 are, for example, a red subpixel R for displaying red, a green subpixel G for displaying green, a blue subpixel B for displaying blue, a cyan subpixel C for displaying cyan, a magenta subpixel M for displaying magenta, and a yellow subpixel Ye for displaying yellow.

Figure 3:
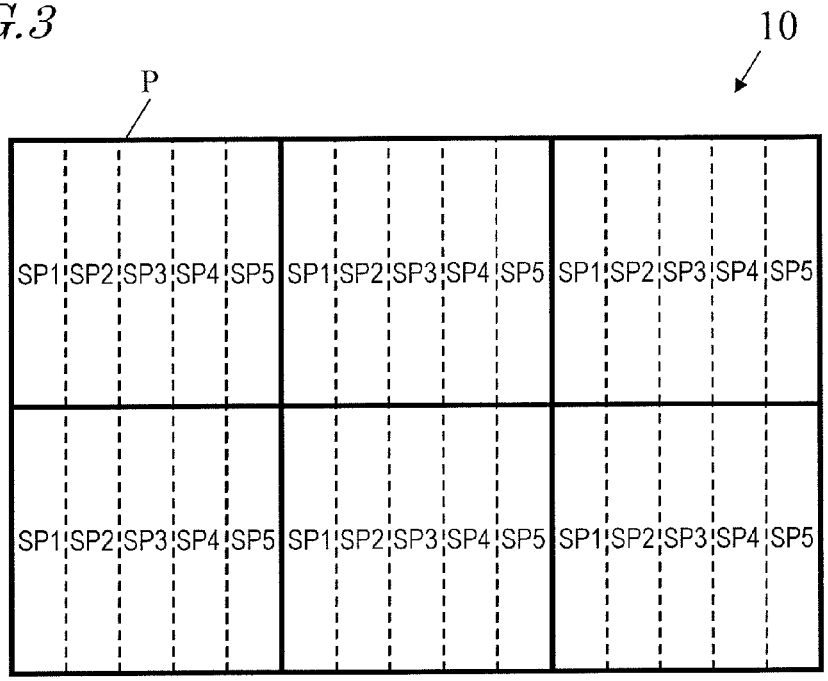
FIG. 3 A diagram showing an exemplary subpixel arrangement of a multiprimary display panel 10 included in the liquid crystal display device 100.
Figure 4:
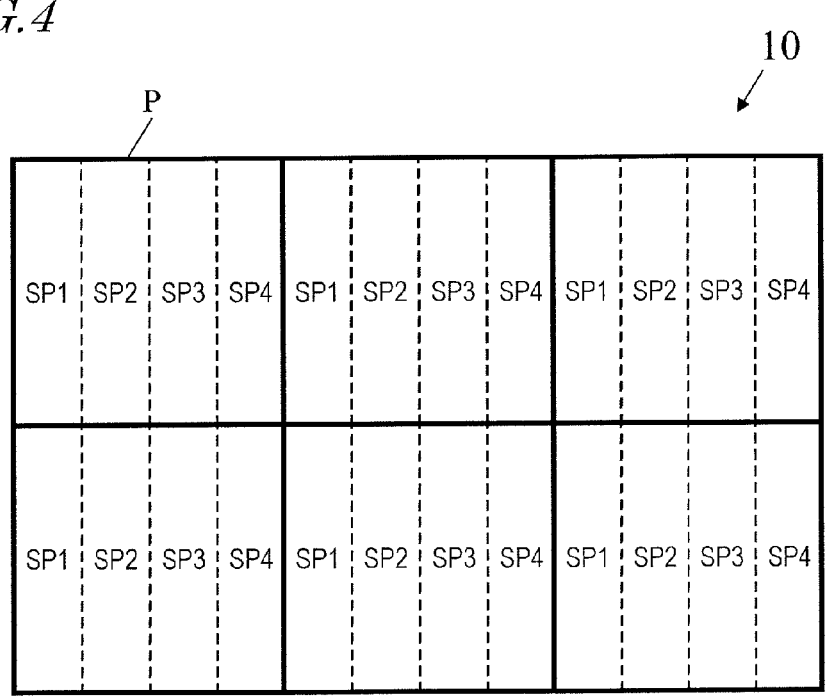
FIG. 4 A diagram showing an exemplary subpixel arrangement of a multiprimary display panel 10 included in the liquid crystal display device 100.

Note that the pixel structure of the multiprimary display panel 10 is not limited to the example shown in FIG. 2. FIG. 3 and FIG. 4 show other examples of the pixel structure of the multiprimary display panel 10.

In the multiprimary display panel 10 shown in FIG. 3, each of the plurality of pixels P arranged in a matrix is composed of five subpixels SP1 to SP5. In each pixel P, the five subpixels SP1 to SP5 are arranged in 1 row by 5 columns. The five subpixels SP1 to SP5 are, for example, a red subpixel R, a green subpixel G, a blue subpixel B, and any two among: a cyan subpixel C; a magenta subpixel M; and a yellow subpixel Ye.

In the multiprimary display panel 10 shown in FIG. 4, each of the plurality of pixels P arranged in a matrix is composed of four subpixels SP1 to SP4. In each pixel P, the four subpixels SP1 to SP4 are arranged in 1 row by 4 columns. The four subpixels SP1 to SP4 are, for example, a red subpixel R, a green subpixel G, a blue subpixel B, and any one among: a cyan subpixel C; a magenta subpixel M; and a yellow subpixel Ye.

It is not a requirement that the plurality of subpixels composing each pixel P only include subpixels which display respectively different colors. For example, a further red subpixel R for displaying red may be provided instead of any of a cyan subpixel C, a magenta subpixel M, and a yellow subpixel Ye. When two red subpixels R are provided in one pixel P, a bright (i.e., having high lightness) red can be displayed. Alternatively, a white subpixel W for displaying white may be provided instead of any of a cyan subpixel C, a magenta subpixel M, and a yellow subpixel Ye. Providing a white subpixel W improves the display luminance of the entire pixel P.

Although FIG. 2 to FIG. 4 illustrate a construction in which the plurality of subpixels in each pixel P are arranged in 1 row by plural columns, the subpixel arrangement in the pixel P is not limited thereto; for example, the plurality of subpixels in each pixel P may be arranged in plural rows by 1 column. However, in order to obtain an effect of resolution improvement along a given direction, it is preferable that a plurality of subpixels exist along that direction within each pixel P. Therefore, from the standpoint of obtaining an effect of resolution improvement along the row direction, it is preferable that the plurality of subpixels in each pixel P are arranged in two or more columns. From the standpoint of obtaining an effect of resolution improvement along the column direction, it is preferable that the plurality of subpixels in each pixel P are arranged in two or more rows. Moreover, the human eye has a lower resolution along the vertical direction than along the horizontal direction; therefore, preferably, the resolution is to be improved at least along the horizontal direction, and typically, the row direction is (i.e., a plurality of rows composed of a number of pixels P are) substantially parallel to the horizontal direction of the display surface. Therefore, in generic applications, it may be preferable that the plurality of subpixels in each pixel P are arranged in 1 row by plural columns. Hereinafter, unless otherwise specified, an example will be described where the pixel row is substantially parallel to the horizontal direction of the display surface and the plurality of subpixels in each pixel P are arranged in 1 row by plural columns.

As shown in FIG. 1, the signal conversion circuit 20 converts an input image signal corresponding to three primaries (RGB) (three-primary image signal) into an image signal corresponding to four or more primary colors (referred to as a "multiprimary image signal"). The multiprimary image signal which is output from the signal conversion circuit 20 is input to the multiprimary display panel 10, whereby multicolor displaying is performed by using four or more primary colors. The specific construction of the signal conversion circuit 20 will be described in detail later.

In the present specification, the total number of plural pixels P included in the multiprimary display panel 10 is referred to as the "panel resolution". When A pixels P are provided along the row direction and B pixels P are provided along the column direction, the resultant panel resolution is expressed as "A×B". In the present specification, the smallest displaying unit of an input image will also be conveniently referred to as a "pixel", and the total number of pixels in an input image will be referred to as "the resolution of the input image". In this case, too, an input image which is composed of A pixels along the row direction and B pixels along the column direction will be said to have a resolution of "A×B".

Figure 5:
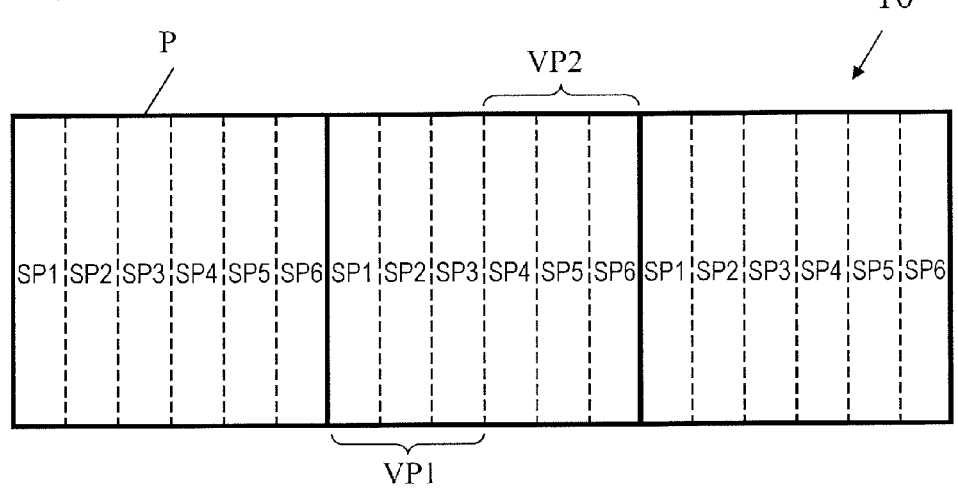
FIG. 5 A diagram showing an exemplary regrouping pattern of a plurality of subpixels into a plurality of virtual pixels.
Figure 6:
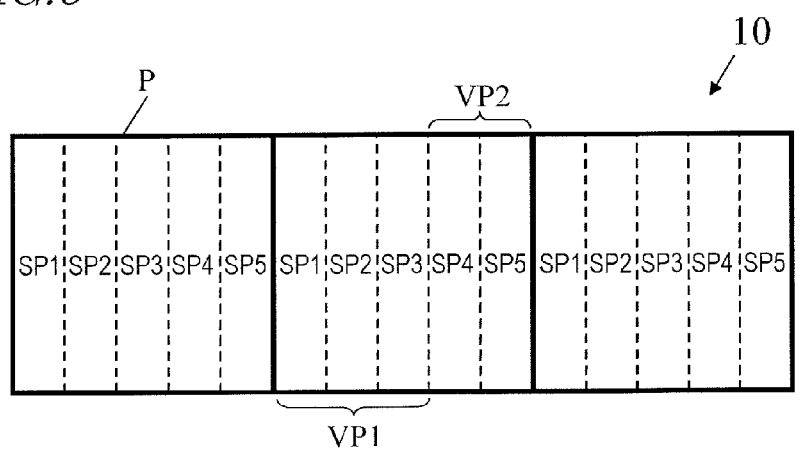
FIG. 6 A diagram showing an exemplary regrouping pattern of a plurality of subpixels into a plurality of virtual pixels.
Figure 7:
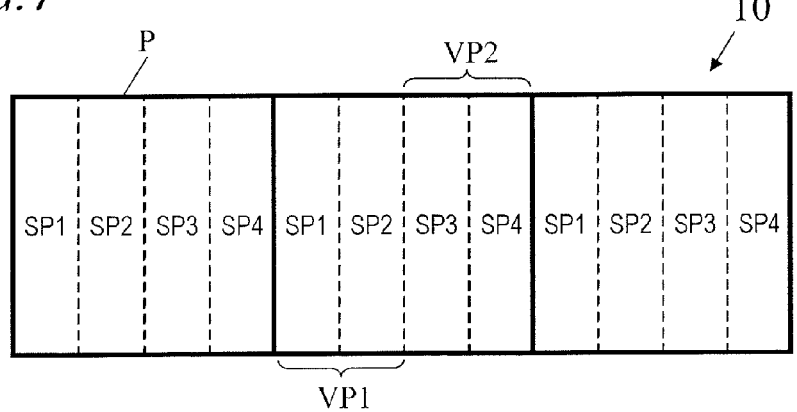
FIG. 7 A diagram showing an exemplary regrouping pattern of a plurality of subpixels into a plurality of virtual pixels.

In the liquid crystal display device 100 in the present embodiment, the plurality of subpixels composing each pixel P are regrouped into a plurality of imaginary pixels (hereinafter referred to as "virtual pixels"), so as to perform display by using each of the plurality of virtual pixels as the smallest unit of multicolor displaying. FIG. 5, FIG. 6, and FIG. 7 show examples of regrouping patterns by which the plurality of subpixels are regrouped into a plurality of virtual pixels.

In the regrouping pattern shown in FIG. 5, the six subpixels SP1 to SP6 composing each pixel P are regrouped into two virtual pixels (first and second virtual pixels) VP1 and VP2. The first virtual pixel VP1 is composed of three subpixels SP1, SP2, and SP3 among the six subpixels SP1 to SP6. The second virtual pixel VP2 is composed of the remaining three subpixels SP4, SP5, and SP6.

In the regrouping pattern shown in FIG. 6, the five subpixels SP1 to SP5 composing each pixel P are regrouped into two virtual pixels (first and second virtual pixels) VP1 and VP2. The first virtual pixel VP1 is composed of three subpixels SP1, SP2, and SP3 among the five subpixels SP1 to SP5. The second virtual pixel VP2 is composed of the remaining two subpixels SP4 and SP5.

In the regrouping pattern shown in FIG. 7, the four subpixels SP1 to SP4 composing each pixel P are regrouped into two virtual pixels (first and second virtual pixels) VP1 and VP2. The first virtual pixel VP1 is composed of two subpixels SP1 and SP2 among the four subpixels SP1 to SP4. The second virtual pixel VP2 is composed of the remaining two subpixels SP3 and SP4.

Figure 8:
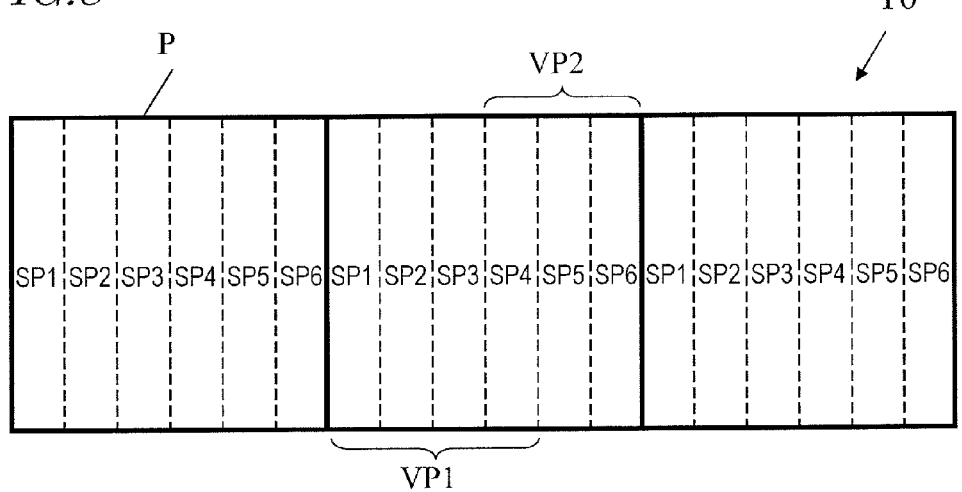
FIG. 8 A diagram showing an exemplary regrouping pattern of a plurality of subpixels into a plurality of virtual pixels.
Figure 9:
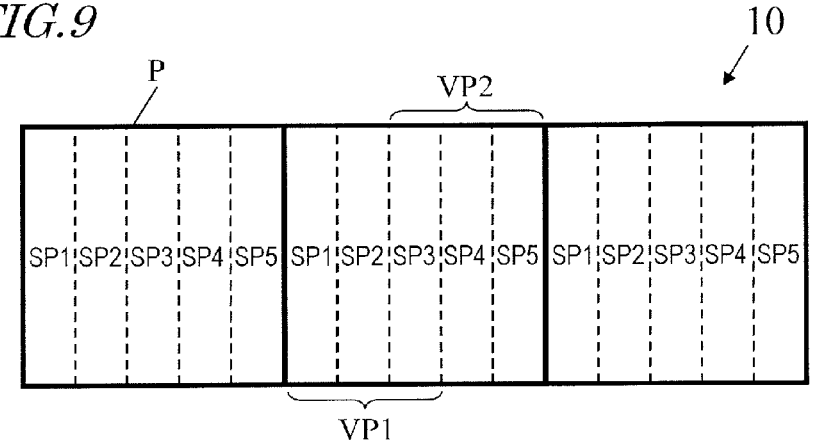
FIG. 9 A diagram showing an exemplary regrouping pattern of a plurality of subpixels into a plurality of virtual pixels.
Figure 10:
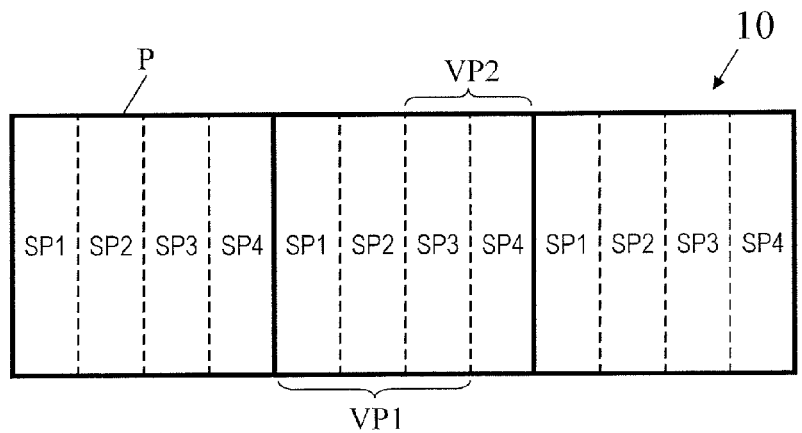
FIG. 10 A diagram showing an exemplary regrouping pattern of a plurality of subpixels into a plurality of virtual pixels.

FIG. 8, FIG. 9, and FIG. 10 show other examples of regrouping patterns. The examples shown in FIG. 8, FIG. 9, and FIG. 10 differ from the regrouping patterns shown in FIG. 5, FIG. 6, and FIG. 7 in that the two or more subpixels composing each virtual pixel include a subpixel which is common to another virtual pixel.

In the regrouping pattern shown in FIG. 8, the six subpixels SP1 to SP6 composing each pixel P are regrouped into two virtual pixels (first and second virtual pixels) VP1 and VP2. The first virtual pixel VP1 is composed of four subpixels SP1, SP2, SP3, and SP4 among the six subpixels SP1 to SP6. The second virtual pixel VP2 is composed of three subpixels SP4, SP5, and SP6. In the example shown in FIG. 8, the subpixel SP4, which is located the fourth from the left in the pixel P, is part of both the first virtual pixel VP1 and the second virtual pixel VP2. That is, the first virtual pixel VP1 and the second virtual pixel VP2 include the common subpixel SP4, such that the subpixel SP4 is shared by them.

In the regrouping pattern shown in FIG. 9, the five subpixels SP1 to SP5 composing each pixel P are regrouped into two virtual pixels (first and second virtual pixels) VP1 and VP2. The first virtual pixel VP1 is composed of three subpixels SP1, SP2, and SP3 among the five subpixels SP1 to SP5. The second virtual pixel VP2 is composed of three subpixels SP3, SP4, and SP5. In the example shown in FIG. 9, the subpixel SP3 located in the center of the pixel P is part of both the first virtual pixel VP1 and the second virtual pixel VP2. That is, the first virtual pixel VP1 and the second virtual pixel VP2 include the common subpixel SP3, such that the subpixel SP3 is shared by them.

In the regrouping pattern shown in FIG. 10, the four subpixels SP1 to SP4 composing each pixel P are regrouped into two virtual pixels (first and second virtual pixels) VP1 and VP2. The first virtual pixel VP1 is composed of three subpixels SP1, SP2, and SP3 among the four subpixels SP1 to SP4. The second virtual pixel VP2 is composed of two subpixels SP3 and SP4. In the example shown in FIG. 10, the subpixel SP3, which is located the third from the left in the pixel P, is part of both the first virtual pixel VP1 and the second virtual pixel VP2. That is, the first virtual pixel VP1 and the second virtual pixel VP2 include the common subpixel SP3, such that the subpixel SP3 is shared by them.

Figure 11:
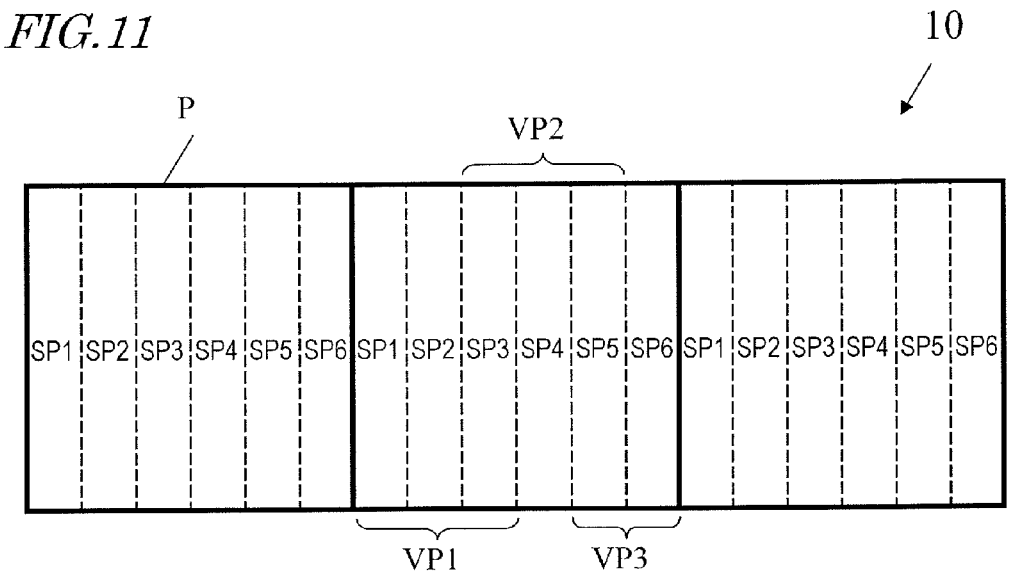
FIG. 11 A diagram showing an exemplary regrouping pattern of a plurality of subpixels into a plurality of virtual pixels.

Although there are two virtual pixels in the regrouping patterns illustrated in FIG. 5 to FIG. 10, the number of virtual pixels is not limited to two, but may be three or more. FIG. 11 shows another exemplary regrouping pattern.

In the regrouping pattern shown in FIG. 11, the six subpixels SP1 to SP6 composing each pixel P are regrouped into three virtual pixels (first, second, and third virtual pixels) VP1, VP2, and VP3. The first virtual pixel VP1 is composed of three subpixels SP1, SP2, and SP3 among the six subpixels SP1 to SP6. The second virtual pixel VP2 is composed of three subpixels SP3, SP4, and SP5. Furthermore, the third virtual pixel VP3 is composed of two subpixels SP5 and SP6. In the example shown in FIG. 11, the subpixel SP3, which is located the third from the left in the pixel P, is part of both the first virtual pixel VP1 and the second virtual pixel VP2. That is, the first virtual pixel VP1 and the second virtual pixel VP2 include the common subpixel SP3, such that the subpixel SP3 is shared by them. Moreover, the subpixel SP5, which is located the fifth from the left in the pixel P, is part of both the second virtual pixel VP2 and the third virtual pixel VP3. That is, the second virtual pixel VP2 and the third virtual pixel VP3 include the common subpixel SP5, such that the subpixel SP5 is shared by them.

In the regrouping patterns illustrated in FIG. 5 to FIG. 11, each of the plurality of virtual pixels is composed of two or more contiguous subpixels within one pixel P. However, the present invention is not limited to such regrouping patterns. FIG. 12 to FIG. 15 show other examples of regrouping patterns.

Figure 12:
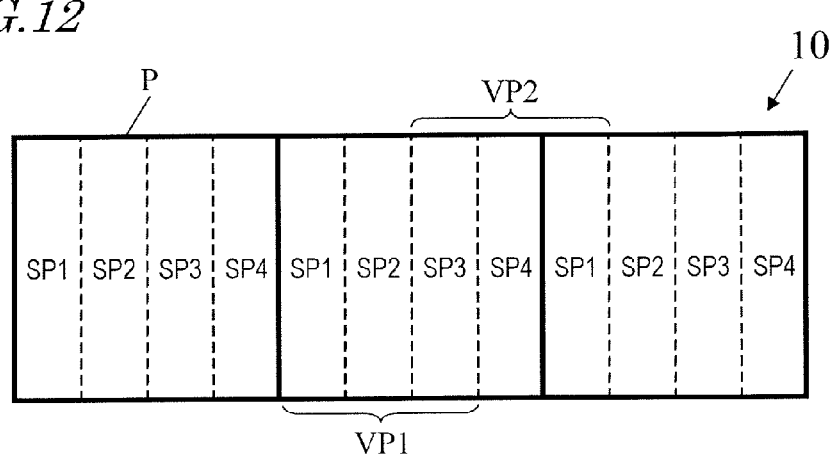
FIG. 12 A diagram showing an exemplary regrouping pattern of a plurality of subpixels into a plurality of virtual pixels.
Figure 13:
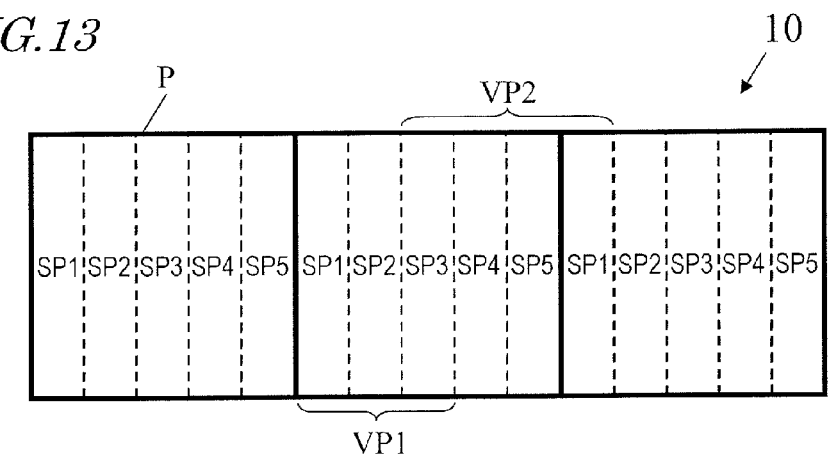
FIG. 13 A diagram showing an exemplary regrouping pattern of a plurality of subpixels into a plurality of virtual pixels.

In the regrouping pattern shown in FIG. 12, the plurality of subpixels SP1 to SP4 are regrouped into two virtual pixels VP1 and VP2; in the regrouping pattern shown in FIG. 13, the plurality of subpixels SP1 to SP5 are regrouped into two virtual pixels VP1 and VP2. In the regrouping pattern show in FIG. 14, the plurality of subpixels SP1 to SP6 are regrouped into two virtual pixels VP1 and VP2; in the regrouping pattern shown in FIG. 15, the plurality of subpixels SP1 to SP6 are regrouped into three virtual pixels VP1, VP2, and VP3.

Between the two virtual pixels VP1 and VP2 shown near the center of FIG. 12, the first virtual pixel VP1 is composed of three subpixels SP1, SP2, and SP3 belonging to the central pixel P. The second virtual pixel VP2 is composed of two subpixels SP3 and SP4 belonging to the central pixel P and one subpixel SP1 belonging to the right pixel P. In this example, the first virtual pixel VP1 shares the subpixel SP3, which is located the third from the left in the pixel P, with the second virtual pixel VP2. Moreover, the second virtual pixel VP2 shares the subpixel SP1, which is located the leftmost in the pixel P, with another first virtual pixel (a virtual pixel which is composed of three subpixels SP1, SP2, and SP3 belonging to the right pixel P) VP1.

Between the two virtual pixels VP1 and VP2 shown near the center of FIG. 13, the first virtual pixel VP1 is composed of three subpixels SP1, SP2, and SP3 belonging to the central pixel P. The second virtual pixel VP2 is composed of three subpixels SP3, SP4, and SP5 belonging to the central pixel P and one subpixel SP1 belonging to the right pixel P. In this example, the first virtual pixel VP1 shares the subpixel SP3, which is located the third from the left in the pixel P, with the second virtual pixel VP2. The second virtual pixel VP2 shares the subpixel SP1, which is located the leftmost in the pixel P, with another first virtual pixel (a virtual pixel which is composed of three subpixels SP1, SP2, and SP3 of the right pixel P) VP1.

Figure 14:
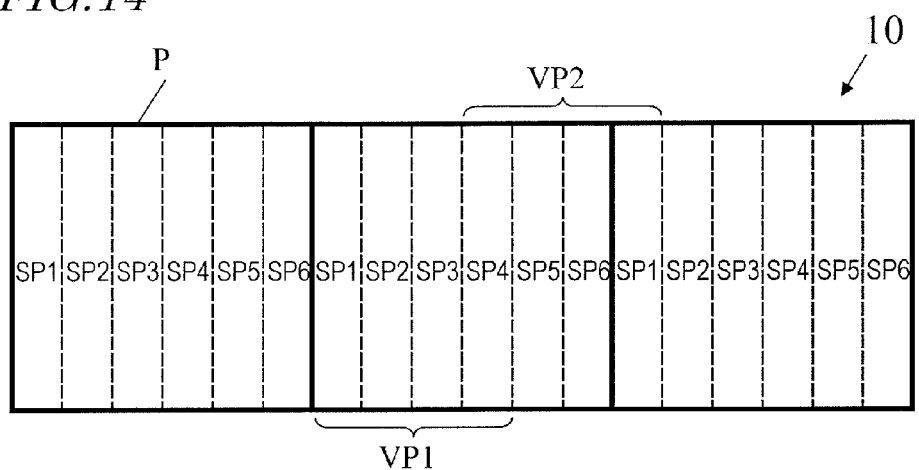
FIG. 14 A diagram showing an exemplary regrouping pattern of a plurality of subpixels into a plurality of virtual pixels.

Between the two virtual pixels VP1 and VP2 shown near the center of FIG. 14, the first virtual pixel VP1 is composed of four subpixels SP1, SP2, SP3, and SP4 belonging to the central pixel P. The second virtual pixel VP2 is composed of three subpixels SP4, SP5, and SP6 belonging to the central pixel P and one subpixel SP1 belonging to the right pixel P. In this example, the first virtual pixel VP1 shares the subpixel SP4, which is located the fourth from the left in the pixel P, with the second virtual pixel VP2. Moreover, the second virtual pixel VP2 shares the subpixel SP1, which is located the leftmost in the pixel P, with another first virtual pixel (a virtual pixel which is composed of four subpixels SP1, SP2, SP3, and SP4 belonging to the right pixel P) VP1.

Figure 15:
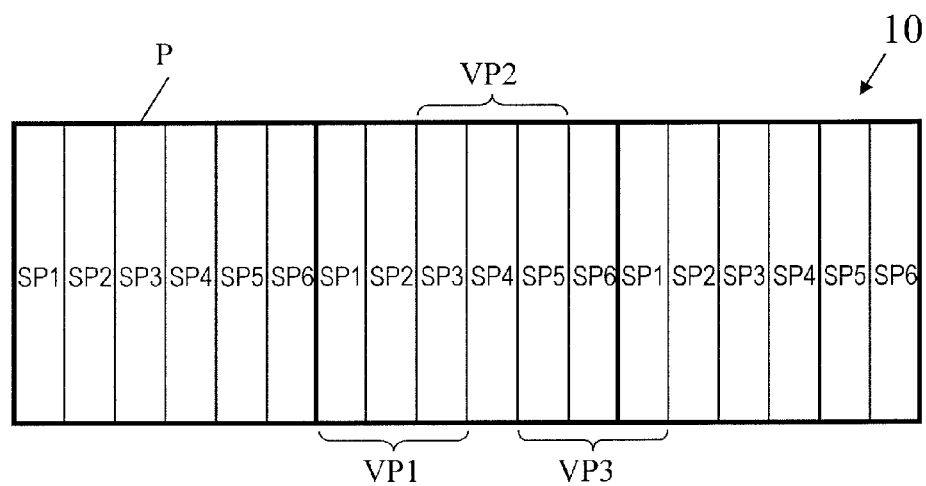
FIG. 15 A diagram showing an exemplary regrouping pattern of a plurality of subpixels into a plurality of virtual pixels.

Among the three virtual pixels VP1, VP2, and VP3 shown near the center of FIG. 15, the first virtual pixel VP1 is composed of three subpixels SP1, SP2, and SP3 belonging to the central pixel P. The second virtual pixel VP2 is composed of three subpixels SP3, SP4, and SP5 belonging to the central pixel P, whereas the third virtual pixel VP3 is composed of two subpixels SP5 and SP6 belonging to the central pixel P and one subpixel SP1 belonging to the right pixel P. In this example, the first virtual pixel VP1 shares the subpixel SP3, which is located the third from the left in the pixel P, with the second virtual pixel VP2. Moreover, the second virtual pixel VP2 shares the subpixel SP5, which is located the fifth from the left in the pixel P, with the third virtual pixel VP3. The third virtual pixel VP3 shares the subpixel SP1, which is located the leftmost in the pixel P, with another first virtual pixel (a virtual pixel which is composed of subpixels SP1, SP2, and SP3 belonging to the right pixel P) VP1.

In the examples shown in FIG. 12 to FIG. 15, the second virtual pixel VP2 or the third virtual pixel VP3 is composed of a number of contiguous subpixels across two pixels P. Thus, some virtual pixels may straddle two pixels P.

As described above, in the liquid crystal display device 100 of the present embodiment, the plurality of subpixels composing each pixel P are regrouped into a plurality of virtual pixels, so as to perform display by using each virtual pixel as the smallest unit of multicolor displaying. This allows the displaying resolution (i.e., the resolution of an image which is displayed on the display surface) to be greater than the panel resolution (i.e., a physical resolution which is specific to the panel, being defined by the total number of pixels P).

For example, according to the regrouping patterns shown in FIG. 5 to FIG. 10 and FIG. 12 to FIG. 14, two adjoining virtual pixels VP1 and VP2 along the row direction (horizontal direction) are composed for each pixel P, whereby the displaying resolution can be made twice as large along the horizontal direction. This allows an input image having a resolution of "2A×B" to be displayed on a multiprimary display panel 10 whose panel resolution is "A×B". According to the regrouping patterns shown in FIG. 11 and FIG. 15, three adjoining virtual pixels VP1, VP2, and VP3 along the row direction (horizontal direction) are composed for each pixel P, whereby the displaying resolution can be made three times as large along the horizontal direction. This allows an input image having a resolution of "3A×B" to be displayed on a multiprimary display panel 10 whose panel resolution is "A×B".

Therefore, in the liquid crystal display device 100 of the present embodiment, even if the resolution of an input image is higher than the panel resolution, it is possible to suitably perform display. Alternatively, an input image can be displayed in reduced size in a portion of the display surface.

Thus, the liquid crystal display device (multiprimary display device) 100 of the present embodiment can provide a displaying resolution that is higher than the panel resolution, so that an image having a similar or higher resolution can be displayed with the same subpixel size and screen size as those of the three-primary display device. Moreover, it can be produced with a similar cost to that of a three-primary display device.

Preferably, the liquid crystal display device 100 is capable of changing the regrouping patterns by which the plurality of subpixels are regrouped into a plurality of virtual pixels. This allows to adjust the degree of improvement in displaying resolution. For example, by switching between the regrouping pattern shown in FIG. 8 and the regrouping pattern shown in FIG. 11, the degree of improvement in displaying resolution along the horizontal direction can be switched between twofold and threefold.

Note that to "change the regrouping pattern" of subpixels does not only mean changing the number of virtual pixels per pixel P. To "change the regrouping pattern" of subpixels also means changing the number and combination of subpixels composing a virtual pixel. Although in some cases it may be difficult to ensure that there is zero color difference (luminance difference and chromaticity difference) among a number of virtual pixels at the maximum output, changing the number and combination of subpixels composing a virtual pixel will allow an appropriate one to be selected from among a set of virtual pixels with small luminance differences, a set of virtual pixels with small chromaticity differences, and so on, in accordance with the type of input image, purpose of displaying, etc.

When performing high-resolution display by using virtual pixels, a sufficiently good high-range fidelity may not be attained depending on the regrouping pattern. From the standpoint of obtaining a good high-range fidelity, it is preferable that each of the plurality of virtual pixels is composed of a subset of the plurality of subpixels (i.e., not of all subpixels). It is also preferable that each of the plurality of virtual pixels is composed of two or more subpixels among the plurality of subpixels (i.e., not of only one subpixel).

In the case where each of the plurality of virtual pixels is composed of two or more subpixels, it is preferable that, as in the regrouping patterns illustrated in FIG. 8 to FIG. 15, the two or more subpixels composing each virtual pixel include a subpixel which is common to another virtual pixel (that is, a subpixel that displays the same primary color is commonly assigned to another virtual pixel). Based on such sharing of a subpixel among a number of virtual pixels, the number and kinds of subpixels composing each virtual pixel are increased, thus making it easier to ensure sufficient luminance in each virtual pixel, and reproduce a desired color (e.g., white).

Figure 16:
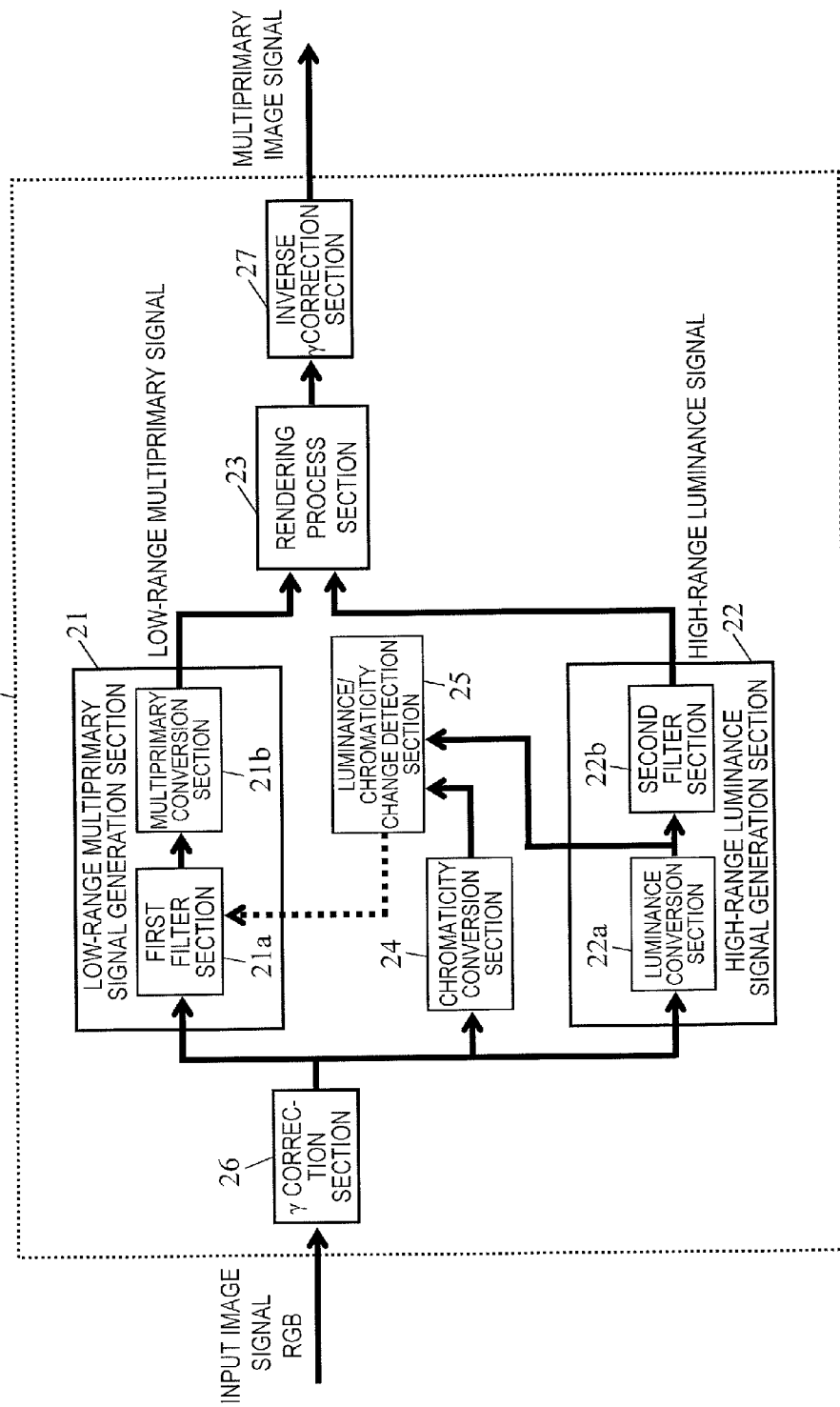
FIG. 16 A block diagram showing a specific construction for a signal conversion circuit 20 included in the liquid crystal display device 100.

Next, the specific construction of the signal conversion circuit 20 will be described. FIG. 16 shows an exemplary specific construction of the signal conversion circuit 20.

As shown in FIG. 16, the signal conversion circuit includes a low-range multiprimary signal generation section 21, a high-range luminance signal generation section 22, a rendering process section 23, a chromaticity conversion section 24, and a luminance/chromaticity change detection section 25. The signal conversion circuit 20 further includes a γ correction section 26 and an inverse γ correction section 27.

The input image signal to the signal conversion circuit 20 is first subjected to a γ correction process by the γ correction section 26. The image signal which has undergone the γ correction process is then input to the low-range multiprimary signal generation section 21, the high-range luminance signal generation section 22, and the chromaticity conversion section 24.

Based on the input image signal, the low-range multiprimary signal generation section 21 generates a low-range multiprimary signal. The low-range multiprimary signal is a signal in which a low-range component (a component having a relatively low spacial frequency) of the input image signal has been adapted to multiprimaries (i.e., converted so as to correspond to four or more primary colors).

Specifically, the low-range multiprimary signal generation section 21 includes a first filter section (low-pass filter section) 21a and a multiprimary conversion section 21b. The first filter section 21a is capable of extracting a low-range component from an input image signal (note however that extraction of a low-range component, i.e., filtering, may substantially be omitted, as will be described later). A low-range component of the input image signal which has been extracted by the first filter section 21a is adapted to multiprimaries by the multiprimary conversion section 21b. The low-range component which has been adapted to multiprimaries is output as a low-range multiprimary signal. Various known techniques can be used for the adaptation to multiprimaries by the multiprimary conversion section 21b. For example, techniques which are disclosed in International Publication No. 2008/065935 and International Publication No. 2007/097080 can be used.

Based on the input image signal, the high-range luminance signal generation section 22 generates a high-range luminance signal. The high-range luminance signal is a signal in which a high-range component (i.e., a component having a relatively high spacial frequency) of the input image signal has been subjected to luminance conversion.

Specifically, the high-range luminance signal generation section 22 includes a luminance conversion section 22a and a second filter section (high-pass filter section) 22b. The luminance conversion section 22a subjects the input image signal to luminance conversion, thereby generating a luminance signal (luminance component). As a high-range luminance signal, the second filter section 22b extracts a high-range component of the luminance signal generated by the luminance conversion section 22a.

Based on the low-range multiprimary signal generated by the low-range multiprimary signal generation section 21 and the high-range luminance signal generated by the high-range luminance signal generation section 22, the rendering process section 23 performs a rendering process onto a plurality of virtual pixels. The image signal which has been generated through the rendering process is subjected to an inverse γ correction by the inverse γ correction section 27, and output as a multiprimary image signal.

Thus, in the signal conversion circuit 20 of the liquid crystal display device 100 of the present embodiment, human visual characteristics are taken into account, i.e., there being higher sensitivity with respect to a luminance signal than with respect to a color signal (i.e., the luminous factor as to color differences is lower than the luminous factor as to luminance); thus, a multiprimary process is applied to the low-range component of the input image signal, whereas a luminance conversion process is applied to the high-range component. The low-range multiprimary signal and the high-range luminance signal resulting from these processes are combined, and rendered onto virtual pixels, whereby an image signal (multiprimary image signal) corresponding to four or more primary colors is output.

Moreover, as has already been described, the signal conversion circuit 20 of the liquid crystal display device 100 of the present embodiment includes a chromaticity conversion section 24 and a luminance/chromaticity change detection section 25.

The chromaticity conversion section 24 subjects an input image signal to chromaticity conversion to generate a chromaticity signal (chromaticity component). Based on the luminance signal generated by the luminance conversion section 22a and the chromaticity signal generated by the chromaticity conversion section 24, the luminance/chromaticity change detection section 25 detects changes in luminance and chromaticity. Then, in accordance with the result of detection by the luminance/chromaticity change detection section 25, one of a plurality of predefined frequency characteristics profiles is selected as the frequency characteristics profile of the first filter section 21a. Specifically, the frequency characteristics profile of the first filter section 21a is controlled by a control signal which is output from the luminance/chromaticity change detection 25 based on its detection result.

As has already been described, in the multiprimary display devices disclosed in Patent Documents 2 and 3, if the input image includes a region that has some chromaticity differences but has no luminance differences, the perceived resolution will be deteriorated in that region. On the other hand, in the liquid crystal display device 100 of the present embodiment, resolutionary deteriorations in such a region can be prevented by the signal conversion circuit 20 having the aforementioned construction. Hereinafter, the reasons will be specifically described.

Figure 17:
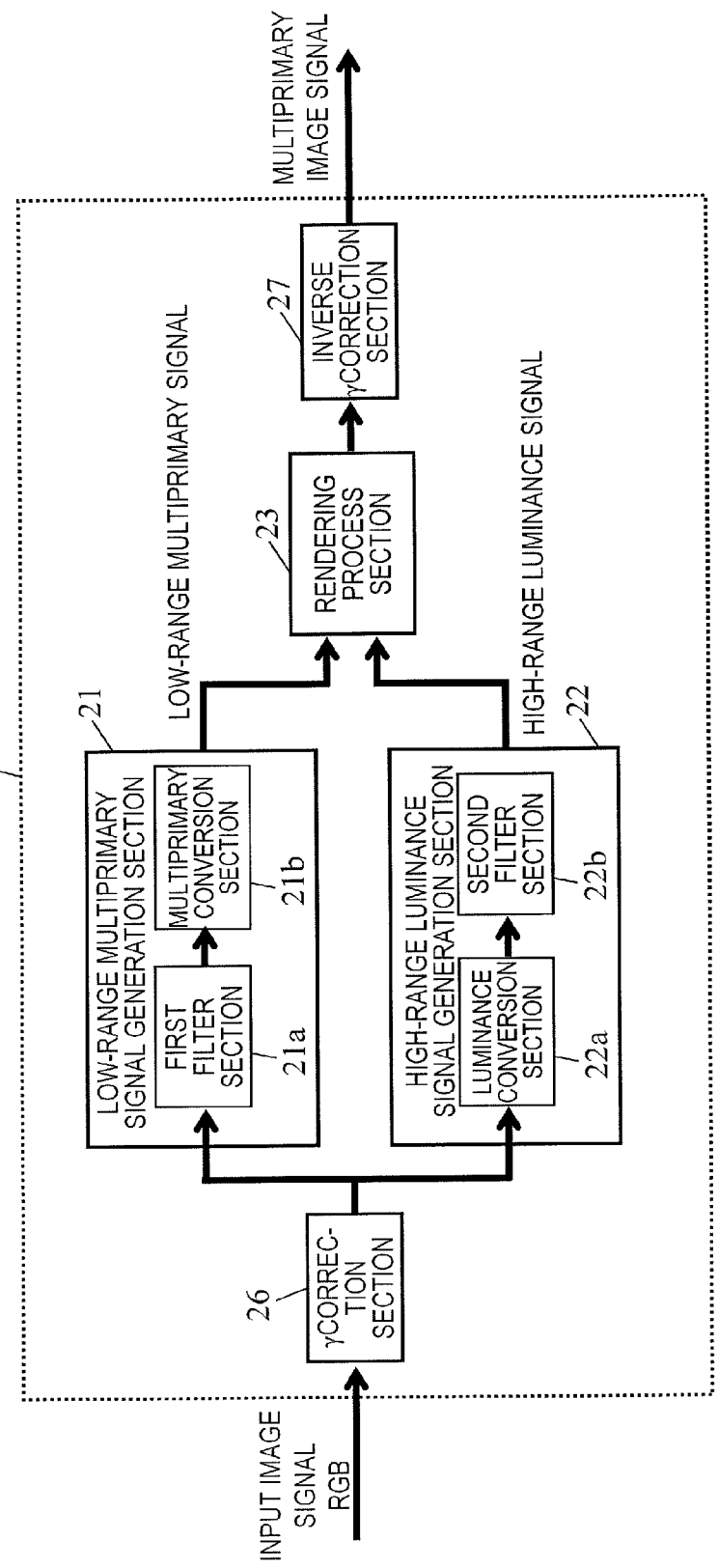
FIG. 17 A block diagram showing the construction of a signal conversion circuit 20' of Comparative Example.

First, rendering onto virtual pixels will be specifically described, in comparison with the case of using the signal conversion circuit 20' of Comparative Example shown in FIG. 17. The signal conversion circuit 20' of Comparative Example shown in FIG. 17 differs from the signal conversion circuit 20 shown in FIG. 16 in that the signal conversion circuit 20' does not include the chromaticity conversion section 24 and the luminance/chromaticity change detection section 25, so that the frequency characteristics profile of the first filter section 21a is always the same.

In the case where the signal conversion circuit 20' of Comparative Example is used, when two virtual pixels are created for each pixel P (i.e., the plurality of subpixels are regrouped into a first virtual pixel and a second virtual pixel), a rendering result V(x,m) which takes the virtual pixels into account is calculated from the formula below. The following description assumes a construction where six subpixels for displaying respectively different primary colors are arranged in 1 row by 6 columns (i.e., along the horizontal direction) in each pixel P.

$$P(x, m) = L(x, m) + H(x) \quad \text{[math. 1]}$$

$$V(x, m) = \begin{cases} W(1, m)P(2x, m) + W(2, m)P(2x - 1, m) & (m = 1, 2, 3) \\ W(1, m)P(2x, m) + W(2, m)P(2x + 1, m) & (m = 4, 5, 6) \end{cases}$$

Herein, x is a pixel position along the row direction; m is a subpixel position within the pixel; L(x,m) is a low-range component of an $m^{th}$ primary color at the pixel position x; and H(x) is a high-range component of luminance at the pixel position x. P(x,m) is a pixel value which is calculated from L(x,m) and H(x); and W(g,m) is a weight (also called a weighting factor) for an $m^{th}$ primary color at a $g^{th}$ virtual pixel. FIG. 18 shows rendering results of a part of a pixel row, where a low-range component, a high-range component, pixel values, weights for the respective primary colors in a first virtual pixel, weights for the respective primary colors in a second virtual pixel, and virtual pixels are taken into consideration.

From the above formula and FIG. 18, it can be seen that, owing to the two virtual pixels, pixel values of two pixels at the input side are rendered onto one pixel (as represented by a rendering result V(x,m)) at the output side. In other words, two pixels' worth of information at the input side is being displayed by one pixel at the output side.

Figure 20:
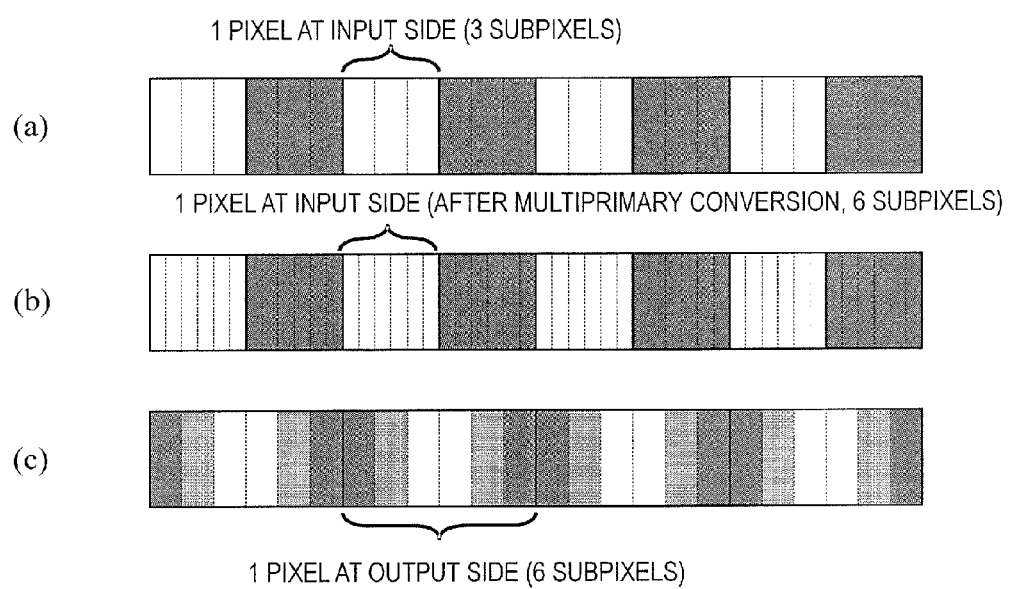
FIG. 20(a) to (c) are diagrams schematically showing a part of a pixel row as indicated by the rendering results shown in FIG. 19, with respect to the input side, the input side (but after multiprimary conversion), and the output side.

FIG. 19 shows pixel values and rendering results when a weight W(1,m) for an $m^{th}$ primary color in the first virtual pixel and a weight W(2,m) for an $m^{th}$ primary color in the second virtual pixel are set as shown in Table 1. FIGS. 20(a), (b), and (c) schematically show a part of a pixel row as indicated by the rendering results shown in FIG. 19, with respect to the input side, the input side (but after multiprimary conversion), and the output side.

TABLE 1

| | m | | | | | |
|---|---|---|---|---|---|---|
| | 1 | 2 | 3 | 4 | 5 | 6 |
| W(1, m) | 0 | 0.5 | 1 | 1 | 0.5 | 0 |
| W(2, m) | 1 | 0.5 | 0 | 0 | 0.5 | 1 |

Every weight (weighting factors) shown in Table 1 is set to either "0", "1", or "0.5". For a given virtual pixel, any subpixel that displays a primary color whose weight is set to 1 allows all luminance that it can output to contribute to the displaying by that virtual pixel. On the other hand, any subpixel that displays a primary color whose weight is set to 0 does not contribute to the displaying by that virtual pixel at all. In other words, it may be said that any subpixel that displays a primary color whose weight is set to 0 does not compose that virtual pixel. Moreover, any subpixel that displays a primary color whose weight is set to 0.5 allows a half of the luminance that it can output to contribute to the displaying by that virtual pixel. Thus, any subpixel that displays a primary color whose weight is set above 0 (but less than 1) for a plurality of pixels contribute to the displaying by the plurality of virtual pixels, and therefore commonly belong to the plurality of virtual pixels (i.e., they are shared by the plurality of virtual pixels). When weights are set as shown in Table 1, the first virtual pixel is composed of four subpixels which display the second, third, fourth, and fifth primary colors, whereas the second virtual pixel is composed of four subpixels which display the first, second, fifth, and sixth primary colors.

In the example indicated by FIGS. 20(a) and (c), the subpixel size at the output side is equal to the subpixel size at the input side. Therefore, the number of pixels at the output side is ½ of the number of pixels at the input side. Normally, displaying an image with a similar resolution to that on the input side would require that a subpixel size at the output side is equal to the subpixel size at the input side after multiprimary conversion as shown in FIG. 20(b). However, through rendering by using two virtual pixels, as shown in FIG. 20(c), it becomes possible to display an image with a similar resolution to that on the input side, at the output side where the subpixel size is the same but the number of pixels is ½ as large as those on the input side.

As described above, the displaying resolution can be improved through a rendering process which takes into account a plurality of virtual pixels per pixel P. The human visual characteristics are known to provide a low sensitivity with respect to changes in the color component, but a high sensitivity with respect to changes in the luminance component. The above-described rendering process technique gives consideration to such characteristics, and performs a process that enhances resolution only with respect to the luminance component, so to speak, thereby attaining an improved resolution for the overall input image. This means that displaying with an improved resolution will not be performed when the magnitude of the high-range luminance signal which is output from the high-range luminance signal generation section 22 is zero, i.e., when no high-range component exists that has passed through the second filter section 22b.

As has already been described, the pixel value P(x,m) is calculated as a sum (P(x,m)=L(x,m)+H(x)) of the low-range component L(x,m) and the high-range component H(x); therefore, when H(x)=0, P(x,m)=L(x,m). In other words, when no high-range component H(x) exists, an image with a deteriorated perceived resolution will be output, as resulting from the input image being subjected to a low-pass filtering process.

There are two cases where no high-range component H(x) may exist.

The first case is where a so-called solid-color image is input as an input image. In this case, only color information of a low-range component exists, whereas no luminance information that passes through the second filter section 22b exists. In this case, however, there is no need to perform display with an improved resolution anyway, so that there is no displaying problem.

The second case is where, although not being a solid-color image but in fact containing various color information, an image whose luminance does not change within the image is input. In other words, this is a case where an image that has some chromaticity differences but has no luminance differences is input. Since there are numerous RGB combinations that may possess a given luminance value I, it naturally follows that those images whose chromaticity changes but whose luminance does not change will exist. When such an image is input, too, there exists no luminance component that passes through the second filter section 22b. Therefore, in this case, displaying with an improved resolution would be preferable, but is not in fact performed.

When the signal conversion circuit 20 according to the present embodiment (shown in FIG. 16) is used, the luminance/chromaticity change detection section 25 detects changes in luminance and chromaticity based on the luminance signal generated by the luminance conversion section 22a and the chromaticity signal generated by the chromaticity conversion section 24, and a frequency characteristics profile is selected for the first filter section 21a in accordance with the detection results. Therefore, for any region that has some chromaticity differences but has no luminance differences, the frequency characteristics profile of the first filter section 21a can be altered in an adaptive manner so that deteriorations in perceived resolution are prevented (specifically, so as to reduce decrease in the high-range component). Hereinafter, a specific methodology for the signal conversion circuit 20 to select a frequency characteristics profile for the first filter section 21a will be described.

Embodiment 1

In the present embodiment, in accordance with a result of detection by the luminance/chromaticity change detection section 25, the first filter section 21a either extracts a low-range component from the input image signal, or passes the input image signal substantially without being filtered. In other words, the plurality of frequency characteristics profiles which are prepared for the first filter section 21a include a frequency characteristics profile which causes the first filter section 21a to pass the input image signal substantially without being filtered.

Table 2 below shows a relationship between changes in luminance and chromaticity and the frequency characteristics profile of the first filter section 21a.

TABLE 2

|  |  | change in luminance | |
| --- | --- | --- | --- |
|  |  | small (within second range of luminance change) | large (within first range of luminance change) |
| change in chromaticity | small (within first range of chromaticity change) | LPF | LPF |
|  | large (within second range of chromaticity change) | all-band pass | LPF |

As shown in Table 2, when a detected change in luminance is relatively large (i.e., within a predetermined first range of luminance change), a frequency characteristics profile (indicated as "LPF" in Table 2) is selected which will cause the first filter section 21a to extract a low-range component from the input image signal. When the change in luminance is large, the output (a non-zero high-range component) from the second filter section 22b will be reflected in the output image, so that there is no problem in the first filter section 21a applying a usual LPF.

Moreover, also when a detected change in luminance is relatively small (i.e., within a second range of luminance change which lies below the lower limit of the first range of luminance change) and a detected change in chromaticity is relatively small (i.e., within a predetermined first range of chromaticity change), a frequency characteristics profile is selected which will cause the first filter section 21a to extract a low-range component from the input image signal. When the change in luminance and the change in chromaticity are both small, that region is a solid, single-colored (or something similar) region, so that there exists no high-range component to begin with. Thus, there is no problem in the first filter section 21a applying a usual LPF.

On the other hand, when a detected change in luminance is relatively small (i.e., within a second range of luminance change) and a detected change in chromaticity is relatively large (i.e., within a second range of chromaticity change which lies above the upper limit of the first range of chromaticity change), a frequency characteristics profile is selected which will cause the first filter section 21a to pass the input image signal substantially without being filtered (indicated as "all-band pass" in Table 2). A region that has small changes in luminance and large changes in chromaticity will have its perceived resolution deteriorated when the signal conversion circuit 20' of Comparative Example is used. In the present embodiment, for any such region, the first filter section 21a passes the input image signal substantially without being filtered; as a result, a signal that has not suffered from a decrease in resolution through a low-pass filtering process will be available for subsequent processes, thereby preventing deteriorations in the perceived resolution of the output image.

The first filter section 21a is typically a digital filter whose frequency characteristics profile is defined by filter coefficients. FIG. 21 shows the relationship between a signal which is input to the first filter section 21a, filter coefficients of the first filter section 21a, and a signal which is output from the first filter section 21a.

Herein, a case will be considered where a signal as shown in FIG. 21(a) is input to the first filter section 21a.

When the first filter section 21a applies a usual LPF, based on a control signal from the luminance/chromaticity change detection section 25, those which are shown on the left side of FIG. 21(b) are selected as the filter coefficients of the first filter section 21a, for example. When such filter coefficients are adopted, the first filter section 21a outputs a signal as indicated on the right side of FIG. 21(b). As a result, a signal whose high-range component has been cut off will be output from the first filter section 21a.

On the other hand, when the first filter section 21a applies no filtering, based on a control signal from the luminance/chromaticity change detection section 25, those which are shown on the left side of FIG. 21(c) are selected as the filter coefficients of the first filter section 21a, for example. When such filter coefficients are adopted, the first filter section 21a outputs a signal as indicated on the right side of FIG. 21(c). As a result, a signal whose high-range component has not been cut off (i.e., the same signal as the input signal) will be output from the first filter section 21a.

Thus, either a signal whose high-range component has been cut off or a signal whose high-range component has not been cut off signal is selectively output from the first filter section 21a, thereby preventing deteriorations in the perceived resolution of the final output image.

The ranges in which the first filter section 21a is to pass the entire band, i.e., the second range of luminance change and the second range of chromaticity change, may appropriately be set in accordance with the specifications, application, and the like of the liquid crystal display device 100.

Embodiment 2

In the present embodiment, in accordance with a result of detection by the luminance/chromaticity change detection section 25, the first filter section 21a either extracts a low-range component from the input image signal with a first frequency characteristics profile, or extracts a low-range component from the input image signal with a second frequency characteristics profile which is gentler than the first frequency characteristics profile.

Table 3 below shows a relationship between changes in luminance and chromaticity and the frequency characteristics profile of the first filter section 21a.

TABLE 3

|  |  | change in luminance | |
| --- | --- | --- | --- |
|  |  | small (within second range of luminance change) | large (within first range of luminance change) |
| change in chromaticity | small (within first range of chromaticity change) | LPF1 | LPF1 |
|  | large (within second range of chromaticity change) | LPF2 | LPF1 |

As shown in Table 3, when a detected change in luminance is relatively large (i.e., within a predetermined first range of luminance change), a first frequency characteristics profile which causes the first filter section 21a to extract a low-range component from the input image signal (indicated as "LPF1" in Table 3) is selected.

Moreover, also when a detected change in luminance is relatively small (i.e., within a second range of luminance change which lies below the lower limit of the first range of luminance change) and a detected change in chromaticity is relatively small (i.e., within a predetermined first range of chromaticity change), a first frequency characteristics profile is selected which will cause the first filter section 21a to extract a low-range component from the input image signal.

On the other hand, when a detected change in luminance is relatively small (i.e., within a second range of luminance change) and a detected change in chromaticity is relatively large (i.e., within a second range of chromaticity change which lies above the upper limit of the first range of chromaticity change), a second frequency characteristics profile which is gentler than the first frequency characteristics profile (indicated as "LPF2" in Table 3) is selected as the frequency characteristics profile of the first filter section 21a.

FIG. 22 shows the relationship between a signal which is input to the first filter section 21a, filter coefficients of the first filter section 21a, and a signal which is output from the first filter section 21a.

Herein, a case will be considered where a signal as shown in FIG. 22(a) is input to the first filter section 21a.

When the first filter section 21a applies a usual LPF, based on a control signal from the luminance/chromaticity change detection section 25, those which are shown on the left side of FIG. 22(b) are selected as the filter coefficients of the first filter section 21a, for example. When such filter coefficients are adopted, the first filter section 21a outputs a signal as indicated on the right side of FIG. 22(b). As a result, a signal whose high-range component has been cut off will be output from the first filter section 21a.

When the first filter section 21a applies an LPF which leaves more of a high-range component than does a usual LPF, based on a control signal from the luminance/chromaticity change detection section 25, those which are shown on the left side of FIG. 22(c) are selected as the filter coefficients of the first filter section 21a, for example. When such filter coefficients are adopted, the first filter section 21a outputs a signal as indicated on the right side of FIG. 22(c). As a result, a signal having not so much of a high-range component as if the entire band has been passed, but more of a high-range component than is allowed by a usual LPF, will be output from the first filter section 21a.

On the other hand, if the output signal from the first filter section 21a contains a strong high-range component, there is a possibility that convolutions or the like may occur during the rendering process by the rendering process section 23, thus resulting in associated deteriorations in the image quality.

In the present embodiment, for any region having small changes in luminance but large changes in chromaticity, the first filter section 21a applies an LPF which leaves not so much of a high-range component as if the entire band has been passed but more of a high-range component than is allowed by a usual LPF; as a result, convolutions or the like are reduced while suppressing deteriorations in perceived resolution.

The range in which the first filter section 21a applies an LPF which leaves more of a high-range component than is allowed by a usual LPF, i.e., the second range of luminance change and the second range of chromaticity change, may appropriately be set in accordance with the specifications, application, and the like of the liquid crystal display device 100.

Embodiment 3

While Embodiments 1 and 2 illustrate that two frequency characteristics profiles are provided for the first filter section 21a, three or more may instead be provided.

In the present embodiment, in accordance with a result of detection by the luminance/chromaticity change detection section 25, the first filter section 21a either extracts a low-range component from the input image signal with a first frequency characteristics profile, extracts a low-range component from the input image signal with a second frequency characteristics profile which is gentler than the first frequency characteristics profile, or passes the input image signal substantially without being filtered.

Table 4 below shows a relationship between changes in luminance and chromaticity and the frequency characteristics profile of the first filter section 21a.

TABLE 4

|  |  | change in luminance | | |
| --- | --- | --- | --- | --- |
|  |  | small (within third range of luminance change) | medium (within second range of luminance change) | large (within first range of luminance change) |
| change in chromaticity | small (within first range of chromaticity change) | LPF1 | LPF1 | LPF1 |
|  | medium (within second range of chromaticity change) | LPF2 | LPF2 | LPF1 |

TABLE 4-continued

| | change in luminance | | |
| --- | --- | --- | --- |
| | small (within third range of luminance change) | medium (within second range of luminance change) | large (within first range of luminance change) |
| large (within third range of chromaticity change) | all-band pass | LPF2 | LPF1 |

As shown in Table 4, when a detected change in luminance is relatively large (i.e., within a predetermined first range of luminance change), a first frequency characteristics profile which causes the first filter section 21a to extract a low-range component from the input image signal (indicated as "LPF1" in Table 4) is selected.

Also when a detected change in chromaticity is relatively small (i.e., within a predetermined first range of chromaticity change), a first frequency characteristics profile which causes the first filter section 21a to extract a low-range component from the input image signal is selected.

When a detected change in luminance is medium (i.e., within a second range of luminance change which lies below the lower limit of the first range of luminance change) and a detected change in chromaticity is medium (i.e., within a second range of chromaticity change which lies above the upper limit of the first range of chromaticity change), a second frequency characteristics profile which is gentler than the first frequency characteristics profile (indicated as "LPF2" in Table 4) is selected as the frequency characteristics profile of the first filter section 21a.

Also when a detected change in luminance is relatively small (i.e., within a third range of luminance change which lies below the lower limit of the second range of luminance change) and a detected change in chromaticity is medium (i.e., within the second range of chromaticity change), the second frequency characteristics profile is selected.

Furthermore, the second frequency characteristics profile is selected also when a detected change in luminance is medium (i.e., within the second range of luminance change) and a detected change in chromaticity is relatively large (i.e., within a third range of chromaticity change which lies above the upper limit of the second range of chromaticity change).

On the other hand, when a detected change in luminance is relatively small (i.e., within the third range of luminance change) and a detected change in chromaticity is relatively large (i.e., within the third range of chromaticity change), a frequency characteristics profile is selected which will cause the first filter section 21a to pass the input image signal substantially without being filtered (indicated as "all-band pass" in Table 4).

FIG. 23 shows the relationship between a signal which is input to the first filter section 21a, filter coefficients of the first filter section 21a, and a signal which is output from the first filter section 21a.

Herein, a case will be considered where a signal as shown in FIG. 23(a) is input to the first filter section 21a.

When the first filter section 21a applies a usual LPF, based on a control signal from the luminance/chromaticity change detection section 25, those which are shown on the left side of FIG. 23(b) are selected as the filter coefficients of the first filter section 21a, for example. When such filter coefficients are adopted, the first filter section 21a outputs a signal as indicated on the right side of FIG. 23(b). As a result, a signal whose high-range component has been cut off will be output from the first filter section 21a.

On the other hand, when the first filter section 21a applies an LPF which leaves more of a high-range component than does a usual LPF, based on a control signal from the luminance/chromaticity change detection section 25, those which are shown on the left side of FIG. 23(c) are selected as the filter coefficients of the first filter section 21a, for example. When such filter coefficients are adopted, the first filter section 21a outputs a signal as indicated on the right side of FIG. 23(c). As a result, a signal having not so much of a high-range component as if the entire band has been passed, but more of a high-range component than is allowed by a usual LPF, will be output from the first filter section 21a.

When the first filter section 21a applies no filtering, based on a control signal from the luminance/chromaticity change detection section 25, those which are shown on the left side of FIG. 23(d) are selected as the filter coefficients of the first filter section 21a, for example. When such filter coefficients are adopted, the first filter section 21a outputs a signal as indicated on the right side of FIG. 23(d). As a result, a signal whose high-range component has not been cut off (i.e., the same signal as the input signal) will be output from the first filter section 21a.

Thus, by selecting the frequency characteristics profile of the first filter section 21a from among three or more frequency characteristics profiles in accordance with a result of detection by the luminance/chromaticity change detection section 25, it becomes possible to attain, with a good balance, prevention of deteriorations in the perceived resolution of the output image and prevention of image quality deteriorations due to convolutions or the like.

The range in which the first filter section 21a passes the entire band and the range in which the first filter section 21a applies an LPF which leaves more of a high-range component than is allowed by a usual LPF, i.e., the second and third ranges of luminance change, and the second and third ranges of chromaticity change, may appropriately be set in accordance with the specifications, application, and the like of the liquid crystal display device 100.

Note that the filter coefficients illustrated in Embodiments 1, 2, and 3 (shown in FIG. 21, FIG. 22, and FIG. 23) are mere examples; the frequency characteristics profile of the first filter section 21a is not to be limited to what is defined by the illustrative filter coefficients.

(Other Constructions of Signal Conversion Circuit)

Figure 24:
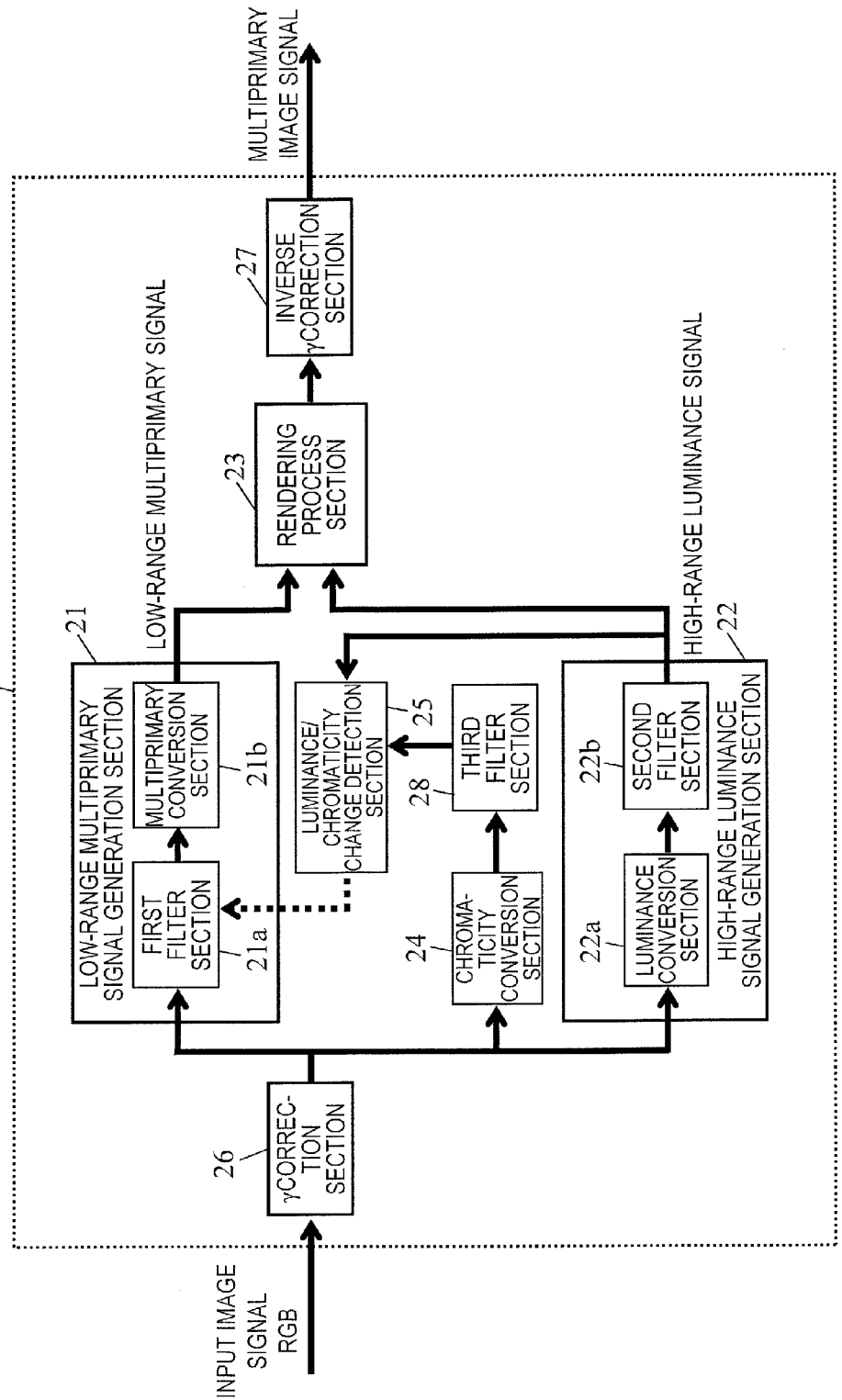
FIG. 24 A block diagram showing another exemplary specific construction for the signal conversion circuit 20 included in the liquid crystal display device 100.
Figure 25:
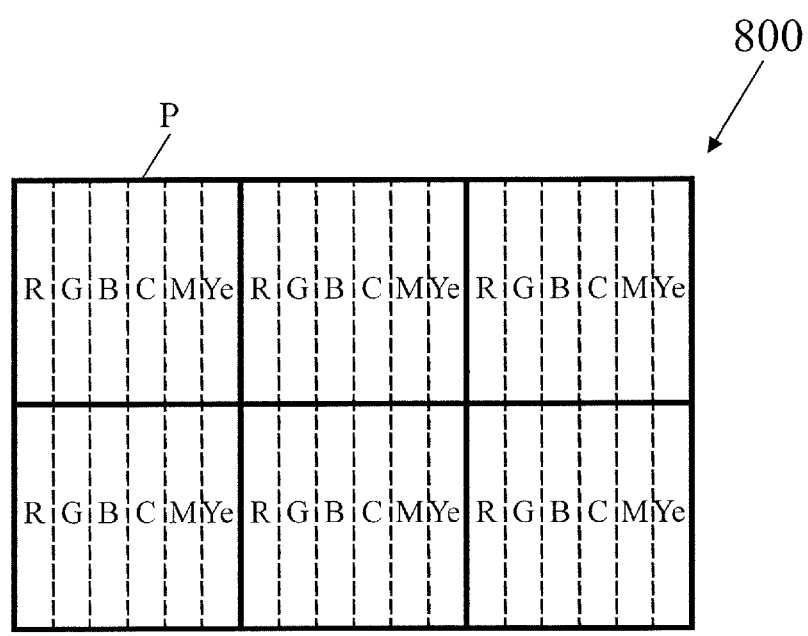
FIG. 25 A diagram schematically showing a conventional display device 800 which performs display by using six primary colors.

FIG. 24 shows other constructions of the signal conversion circuit 20. The construction shown in FIG. 24 differs from the construction shown in FIG. 16 in that the signal conversion circuit 20 further includes a third filter section (high-pass filter section) 28. The third filter section 28 extracts a high-range component from the chromaticity signal generated by the chromaticity conversion section 24.

In the construction shown in FIG. 24, the luminance signal and the chromaticity signal are input to the luminance/chromaticity change detection section 25 after passing through the second filter section 22b and the third filter section 28, respectively. In other words, in this construction, changes in luminance and chromaticity are detected by monitoring the magnitude of the high-pass filter (HPF) output. As can be seen from FIG. 16, HPF output calculation has always been conducted with respect to luminance; therefore, utilizing the HPF output to detect changes in luminance and chromaticity simplifies the circuit construction of the luminance/chromaticity change detection section 25, and facilitates implementation.

Now, by taking the construction shown in FIG. 24 as an example, a specific method of detecting changes in luminance and changes in chromaticity will be described. It will be appreciated that the method of detecting changes in luminance and changes in chromaticity is not limited to what is described herein.

When an input image signal of an RGB signal is converted into LUV or LAB (or YCbCr, in the case where the processes by the γ correction section 26 and the luminance conversion section 22$a$ and chromaticity conversion section 24 are reversed in order) luminance/chromaticity signals, the second filter section 22$b$ applies an HPF to the luminance signal, and the third filter section 28 applies an HPF to the chromaticity signal. It can be said that, the greater the absolute value of these outputs are, the greater the changes in luminance and chromaticity are. Normalization is conducted by assuming that the absolute value of the HPF output varies from 0 to 1. Then, what is obtained by normalizing the HPF output of the luminance signal is treated as the "change in luminance" in Tables 2 to 4. Since two kinds of chromaticity signals exist, e.g., UV, AB, CbCr, a square root of the sum of squares thereof is treated as the "change in chromaticity" in Tables 2 to 4. In this manner, changes in luminance and changes in chromaticity can be detected.

In the case where the frequency characteristics profile of the first filter section 21$a$ is allowed to vary as shown in Table 2, if changes in luminance and changes in chromaticity are to be detected by using the aforementioned method, the upper limit of the second range of luminance change is e.g. 1/16, and the lower limit of the second range of chromaticity change is e.g. 1/8.

In the case where the frequency characteristics profile of the first filter section 21$a$ is allowed to vary as shown in Table 3, if changes in luminance and changes in chromaticity are to be detected by using the aforementioned method, the upper limit of the second range of luminance change is e.g. 1/16, and the lower limit of the second range of chromaticity change is e.g. 1/8.

In the case where the frequency characteristics profile of the first filter section 21$a$ is allowed to vary as shown in Table 4, if changes in luminance and changes in chromaticity are to be detected by using the aforementioned method, the upper limit of the second range of luminance change is e.g. 1/8, and the upper limit of the third range of luminance change is e.g. 1/16. Alternatively, the lower limit of the second range of chromaticity change is e.g. 1/8, and the lower limit of the third range of chromaticity change is e.g. 1/4.

INDUSTRIAL APPLICABILITY

According to embodiments of the present invention, in a multiprimary display device which can display an image having a similar or higher resolution without the need to reduce the subpixel size relative to a three-primary display device, it is possible to prevent a decrease in the perceived resolution in regions with comparatively small changes in luminance and comparatively large changes in chromaticity. A multiprimary display device according to an embodiment of the present invention is able to perform high-quality display, and therefore is suitably used for various electronic devices such as liquid crystal television sets.

REFERENCE SIGNS LIST

10 multiprimary display panel
20 signal conversion circuit
21 low-range multiprimary signal generation section
21$a$ first filter section
21$b$ multiprimary conversion section
22 high-range luminance signal generation section
22$a$ luminance conversion section
22$b$ second filter section
23 rendering process section
24 chromaticity conversion section
25 luminance/chromaticity change detection section
26 γ correction section
27 inverse γ correction section
28 third filter section
100 liquid crystal display device (multiprimary display device)
P pixel
SP1 to SP6 subpixel
R red subpixel
G green subpixel
B blue subpixel
C cyan subpixel
M magenta subpixel
Ye yellow subpixel
VP1 first virtual pixel
VP2 second virtual pixel
VP3 third virtual pixel

The invention claimed is:

1. A multiprimary display device having a plurality of pixels arranged in a matrix which includes a plurality of rows and a plurality of columns, each of the plurality of pixels being composed of a plurality of subpixels, the plurality of subpixels including at least four subpixels for displaying respectively different colors, the multiprimary display device comprising:
  a multiprimary display panel having the plurality of subpixels in each of the plurality of pixels; and
  a signal conversion circuit which converts an input image signal corresponding to three primaries into a multiprimary image signal corresponding to four or more primary colors, wherein,
  the plurality of subpixels composing each pixel are regrouped into a plurality of virtual pixels so as to perform display by using each of the plurality of virtual pixels as a smallest unit of multicolor displaying;
  the signal conversion circuit includes
  a low-range multiprimary signal generation section which generates a low-range multiprimary signal based on the input image signal, the low-range multiprimary signal being a signal in which a low-range component of the input image signal has been adapted to multiprimaries,
  a high-range luminance signal generation section which generates a high-range luminance signal based on the input image signal, the high-range luminance signal being a signal in which a high-range component of the input image signal has been subjected to luminance conversion, and
  a rendering process section which performs a rendering process onto the plurality of virtual pixels based on the low-range multiprimary signal and the high-range luminance signal;

the low-range multiprimary signal generation section includes
a first filter section capable of extracting a low-range component from the input image signal, and
a multiprimary conversion section which adapts the low-range component extracted by the first filter section to multiprimaries;
the high-range luminance signal generation section includes
a luminance conversion section which subjects the input image signal to luminance conversion to generate a luminance signal, and
a second filter section which extracts a high-range component of the luminance signal generated by the luminance conversion section as the high-range luminance signal;
the signal conversion circuit further includes
a chromaticity conversion section which subjects the input image signal to chromaticity conversion to generate a chromaticity signal, and
a luminance/chromaticity change detection section which detects changes in luminance and chromaticity based on the luminance signal generated by the luminance conversion section and the chromaticity signal generated by the chromaticity conversion section; and
as a frequency characteristics profile of the first filter section, one frequency characteristics profile is selected from among a plurality of predefined frequency characteristics profiles in accordance with a result of detection by the luminance/chromaticity change detection section.

2. The multiprimary display device of claim 1, wherein the plurality of frequency characteristics profiles include a frequency characteristics profile which causes the first filter section to pass the input image signal substantially without being filtered.

3. The multiprimary display device of claim 1, wherein, in accordance with a result of detection by the luminance/chromaticity change detection section, the first filter section either extracts a low-range component from the input image signal or passes the input image signal substantially without being filtered.

4. The multiprimary display device of claim 3, wherein the first filter section
extracts a low-range component from the input image signal when (a) a detected change in luminance is within a predetermined first range of luminance change, and when (b) a detected change in luminance is within a second range of luminance change which lies below a lower limit of the first range of luminance change and a detected change in chromaticity is within a predetermined first range of chromaticity change, or
passes the input image signal substantially without being filtered when (c) a detected change in luminance is within the second range of luminance change and a detected change in chromaticity is within a second range of chromaticity change which lies above an upper limit of the first range of chromaticity change.

5. The multiprimary display device of claim 1, wherein, in accordance with a result of detection by the luminance/chromaticity change detection section, the first filter section either extracts a low-range component from the input image signal with a first frequency characteristics profile, or extracts a low-range component from the input image signal with a second frequency characteristics profile which is gentler than the first frequency characteristics profile.

6. The multiprimary display device of claim 5, wherein the first filter section
extracts a low-range component from the input image signal with the first frequency characteristics profile when (a) a detected change in luminance is within a predetermined first range of luminance change, and when (b) a detected change in luminance is within a second range of luminance change which lies below a lower limit of the first range of luminance change and a detected change in chromaticity is within a predetermined first range of chromaticity change, or
extracts a low-range component from the input image signal with the second frequency characteristics profile when (c) a detected change in luminance is within the second range of luminance change and a detected change in chromaticity is within a second range of chromaticity change which lies above an upper limit of the first range of chromaticity change.

7. The multiprimary display device of claim 1, wherein the plurality of frequency characteristics profiles include three or more frequency characteristics profiles.

8. The multiprimary display device of claim 1, wherein, in accordance with a result of detection by the luminance/chromaticity change detection section, the first filter section either extracts a low-range component from the input image signal with a first frequency characteristics profile, extracts a low-range component from the input image signal with a second frequency characteristics profile which is gentler than the first frequency characteristics profile, or passes the input image signal substantially without being filtered.

9. The multiprimary display device of claim 8, wherein the first filter section
extracts a low-range component from the input image signal with the first frequency characteristics profile when (a) a detected change in luminance is within a predetermined first range of luminance change and when (b) a detected change in chromaticity is within a predetermined first range of chromaticity change,
extracts a low-range component from the input image signal with the second frequency characteristics profile when (c) a detected change in luminance is within a second range of luminance change which lies below a lower limit of the first range of luminance change and a detected change in chromaticity is within a second range of chromaticity change which lies above an upper limit of the first range of chromaticity change, when (d) a detected change in luminance is within a third range of luminance change which lies below a lower limit of the second range of luminance change and a detected change in chromaticity is within the second range of chromaticity change, and when (e) a detected change in luminance is within the second range of luminance change and a detected change in chromaticity is within a third range of chromaticity change which lies above an upper limit of the second range of chromaticity change, or
passes the input image signal substantially without being filtered when (f) a detected change in luminance is within the third range of luminance change and a detected change in chromaticity is within the third range of chromaticity change.

10. The multiprimary display device of claim 1, wherein, the signal conversion circuit further includes a third filter section which extracts a high-range component of the chromaticity signal generated by the chromaticity conversion section; and the luminance signal and the chromaticity signal are input to the luminance/chromaticity change detection section after passing through the second filter section and the third filter section, respectively.

11. The multiprimary display device of claim 1, capable of changing a regrouping pattern of regrouping the plurality of subpixels into the plurality of virtual pixels.

12. The multiprimary display device of claim 1, wherein each of the plurality of virtual pixels is composed of two or more subpixels among the plurality of subpixels.

13. The multiprimary display device of claim 1, wherein,
the plurality of rows are substantially parallel to a horizontal direction of a display surface; and
in each of the plurality of pixels, the plurality of subpixels are arranged in 1 row by plural columns.

14. The multiprimary display device of claim 1, wherein,
the plurality of subpixels include a red subpixel for displaying red, a green subpixel for displaying green, and a blue subpixel for displaying blue; and
the plurality of subpixels further include at least one of a cyan subpixel for displaying cyan, a magenta subpixel for displaying magenta, a yellow subpixel for displaying yellow, a white subpixel for displaying white, and a red subpixel for displaying red.

15. The multiprimary display device of claim 1 being a liquid crystal display device.

\* \* \* \* \*